United States Patent
Mackerron et al.

(10) Patent No.: US 9,711,758 B2
(45) Date of Patent: Jul. 18, 2017

(54) ORGANIC LIGHT-EMITTING DIODE LIGHT SOURCE COMPRISING A POLYESTER FILM AND A METHOD OF IMPROVING LIGHT EXTRACTION FROM SAID LIGHT SOURCE

(71) Applicants: DUPONT TEIJIN FILMS U.S. LIMITED PARTNERSHIP, Chester, VA (US); Nederlandse Organisatie Voor Toegepast Natuurwetenschappelijk Onderzoek TNO, Delft (NL)

(72) Inventors: Duncan Henry Mackerron, Cleveland (GB); Stephan Harkema, Eindhoven (NL); Ian Keith Alexander, Yorkshire (GB)

(73) Assignees: DUPONT TEIJIN FILMS U.S. LIMITED PARTNERSHIP, Chester, VA (US); NEDERLANDSE ORGANISATIE VOOR TOEGPAST NATUURWETENSCHAPPELIJK ONDERZOEK TNO, Delft (NL)

( * ) Notice: Subject to any disclaimer, the term of this patent is extended or adjusted under 35 U.S.C. 154(b) by 0 days.

(21) Appl. No.: 14/907,717
(22) PCT Filed: Jul. 24, 2015
(86) PCT No.: PCT/IB2015/055626
§ 371 (c)(1),
(2) Date: Jan. 26, 2016
(87) PCT Pub. No.: WO2016/016787
PCT Pub. Date: Feb. 4, 2016

(65) Prior Publication Data
US 2017/0162828 A1 Jun. 8, 2017

(30) Foreign Application Priority Data
Aug. 1, 2014 (GB) .................................. 1413681.6

(51) Int. Cl.
H01L 51/52 (2006.01)
H01L 51/50 (2006.01)
H01L 51/56 (2006.01)

(52) U.S. Cl.
CPC ...... *H01L 51/5268* (2013.01); *H01L 51/5012* (2013.01); *H01L 51/5206* (2013.01);
(Continued)

(58) Field of Classification Search
None
See application file for complete search history.

(56) References Cited

U.S. PATENT DOCUMENTS 3,708,225 A 1/1973 Misch
4,177,315 A 12/1979 Ubersax
(Continued)

FOREIGN PATENT DOCUMENTS

CN 101477263 7/2009
CN 102620235 8/2012
(Continued)

OTHER PUBLICATIONS

Cai, Yuankun, "Organic light emitting diodes (OLEDs) and OLED-based structurally integrated optical sensors"(2010) Graduate Thesis and Dissertations, Iowa State University, 2010, 159 pages.
(Continued)

*Primary Examiner* — Michelle Mandala
(74) *Attorney, Agent, or Firm* — RatnerPrestia

(57) ABSTRACT

An organic light-emitting diode (OLED) light source includes, in order:
(i) a biaxially oriented polyester film substrate including light-scattering particles (P1);
(ii) optionally an organic planarising coating layer (OPC1);
(iii) optionally a barrier layer (B1);
(Continued)

(iv) an organic planarising coating layer (OPC2) including light-scattering particles (P2);
(v) optionally a barrier layer (B2); and
(vi) a multi-layer light-emitting assembly including a first electrode, a light-emitting organic layer and a second electrode;

wherein the OLED light source includes at least one of barrier layers (B1) and (B2).

43 Claims, 10 Drawing Sheets

(52) U.S. Cl.
CPC ...... *H01L 51/5221* (2013.01); *H01L 51/5253* (2013.01); *H01L 51/56* (2013.01); *H01L 2251/301* (2013.01); *H01L 2251/303* (2013.01); *H01L 2251/533* (2013.01); *H01L 2251/5338* (2013.01); *H01L 2251/558* (2013.01)

(56) References Cited

U.S. PATENT DOCUMENTS

| | | | |
|---|---|---|---|
| 4,198,465 | A | 4/1980 | Moore |
| 4,309,319 | A | 1/1982 | Vaughn, Jr. |
| 4,436,851 | A | 3/1984 | Vaughn, Jr. |
| 4,455,205 | A | 6/1984 | Olson |
| 5,413,840 | A | 5/1995 | Mizuno |
| 6,198,217 | B1 | 3/2001 | Suzuki |
| 6,303,238 | B1 | 10/2001 | Thompson |
| 8,227,984 | B2 | 7/2012 | Kim |
| 2002/0167692 | A1* | 11/2002 | Cunningham ......... B29C 39/10 359/2 |
| 2003/0127973 | A1 | 7/2003 | Weaver |
| 2005/0112296 | A1 | 5/2005 | Laney |
| 2005/0196584 | A1 | 9/2005 | Halecki |
| 2006/0286395 | A1 | 12/2006 | Goto |
| 2007/0257590 | A1 | 11/2007 | Bechtel |
| 2007/0275218 | A1 | 11/2007 | Kobayashi |
| 2011/0234942 | A1 | 9/2011 | Nakagome |
| 2012/0200929 | A1 | 8/2012 | Lu |
| 2012/0234460 | A1 | 9/2012 | Zhang |
| 2013/0062654 | A1 | 3/2013 | Taima |
| 2013/0078749 | A1 | 3/2013 | Ide |
| 2013/0154473 | A1 | 6/2013 | Kaneko |
| 2013/0155689 | A1 | 6/2013 | Chen |

FOREIGN PATENT DOCUMENTS

| | | |
|---|---|---|
| EP | 1148386 | 10/2001 |
| EP | 1418197 | 5/2004 |
| EP | 1734792 | 12/2006 |
| EP | 1965231 | 9/2008 |
| GB | 2509065 | 6/2014 |
| JP | 2007273440 | 10/2007 |
| JP | 2008169277 | 7/2008 |
| JP | 2009272068 | 11/2009 |
| JP | 2010284943 | 12/2010 |
| JP | 2011002073 | 1/2011 |
| JP | 2012146413 | 8/2012 |
| JP | 2012126810 | 7/2015 |
| WO | 03022575 | 3/2003 |
| WO | 03087247 | 10/2003 |
| WO | 2005052656 | 6/2005 |
| WO | 2007091082 | 8/2007 |
| WO | 2010002755 | 1/2010 |
| WO | 2012029536 | 3/2012 |
| WO | 2012120260 | 9/2012 |
| WO | 2014096785 | 6/2014 |

OTHER PUBLICATIONS

Ciba IRGACURE 2959 Photoinitiator; Ciba Specialty Chemicals Coating Effects Segment; Edition 2498 Basle; pp. 1-3, uploaded to internet Jul. 2011.
Great Britain Search Report for Application No. GB1222858.1 dated Apr. 18, 2013.
Great Britain Search Report for Application No. GB1222858.1 dated May 15, 2014.
Great Britain Search Report for Application No. GB1222858.1 dated Oct. 10, 2014.
Great Britain Search Report for Application No. GB1413681.6, dated Nov. 12, 2014.
Greiner, et al. Japanese Journal of Applied Physics, vol. 46, Part 1, No. 7A, 2007, p. 4125.
International Search Report and Written Opinion for International Application No. PCT/GB2013/053276 mailed Mar. 25, 2014.
International Search Report and Written Opinion of the International Searching Authority for International Application No. PCT/IB2015/055626 mailed Dec. 4, 2015.
Lippold, et al. WYKO Surface Profiler Technical Reference Manual, RST Plus, Second Edition, 980-078 Rev A, Arizona, Apr. 1995, pp. 1-213.
Vandersteegen, et al., Light Omitting Diodes: Research, Manufacturing and Applications XI; edited by Klaus P. Streubel and Heonsu Jeon. Proc. of SPIE vol. 6486, 64860H, 2007.
Yang et al., "Light out-coupling enhancement of organic light-emitting devices with microlens array", Appl. Phys. Lett. 97, 2010 (Abstract Only).
Tyan et al., "Fluorescent White OLED Devices with Improved Light Extraction", SID Symposium Digest of Technical Papers, vol. 39 Issue 1, May 2008, pp. 933-936 (Abstract Only).
Saxena et al., "Implementation of anti-reflection coating to enhance light out-coupling in organic light-emitting devices", Journal of Luminescence, vol. 128, Issue 3, Mar. 2003, pp. 525-530 (Abstract Only).
DMS 803, Autronic Melchers GmbH; technical specification document BR001.4, Apr. 2011.
CIE (1976) uniform chromaticity scale diagram, u\v\ colour space, as a function of angle to the normal to the plane of the OLED, 2014.
Isphording et al., "Quantifying angular color stability of organic light-emitting diodes". Organic Electronics, vol. 11; Issue 12, Dec. 2010, pp. 1916-1919 (Abstract Only).
Tanaka et al., "Precice Measurement of External Quantum Efficiency of Organic; Light-Emitting Devices", Japanese Journal of Applied Physics, vol. 43, Part 1, No. 11A, Nov. 10, 2004 (Abstract Only).
Li et al., "Simulation of transform for external quantum efficiency and power efficiency of electroluminescent devices", Journal of Luminescence, vol. 122-123, Apr. 2007, pp. 626-628 (Abstract Only).
Olla White Paper on the Necessity of Luminous Efficacy Measurement Standardisation of OLED Light Sources, Sep. 25, 2007.

* cited by examiner

ORGANIC LIGHT-EMITTING DIODE LIGHT SOURCE COMPRISING A POLYESTER FILM AND A METHOD OF IMPROVING LIGHT EXTRACTION FROM SAID LIGHT SOURCE

This application is the National Phase filing of International Application No. PCT/IB2015/055626, filed 24 Jul. 2015, and claims priority of GB Application No. 1413681.6, filed 1 Aug. 2014, the entireties of which applications are incorporated herein by reference.

FIELD OF THE INVENTION

The present invention relates to organic light-emitting diode (OLED) light sources and a method of improving light extraction therefrom.

BACKGROUND OF THE INVENTION

OLEDs are electroluminescent devices which have been intensively studied over the past two decades, and have become competitive with established solutions in illumination tasks requiring large-area light sources. Conventionally, OLEDS have consisted of one or more light-emitting organic layers (generally referred to as the light-emitting organic stack) sandwiched between a metallic cathode and a transparent anode deposited on a transparent substrate. Current flowing through the OLED causes the charges carriers (holes and electrons) to recombine in the emissive layer and emit photons. The light-emitting organic layer(s) may be polymeric, and such OLEDs are sometimes referred to as PLEDs. Alternatively or additionally, the light-emitting organic layer(s) may comprise a non-polymeric, small-molecule organic compound, and such OLEDs are sometimes referred to as SMOLEDs. The visible light emitted from an organic layer or layer stack may be white light, or a narrower range of wavelengths in the visible region, depending on the organic molecule and the intended application. Suitable light-emitting organic compounds include the commercially available Livilux™ materials (Merck). For most lighting applications, the output of an OLED light source should be independent of the emission wavelength over the visible spectrum, i.e. a white light is desired. Various approaches have been proposed for the emission of visible white light from an OLED light source, including single white-emitting layers and vertical or horizontal stacks of different organic layers each emitting in a different wavelength in the visible region (typically red-green-blue (RGB) stacks). Typically, the thickness of the OLED stack including the electrodes is not more than 1 μm, whereas the substrate thickness is up to and around 1 mm. Because the organic light-emitting layers are very sensitive to air and moisture, the OLED stack is encapsulated within a barrier. The majority of commercially available devices are currently fabricated on rigid glass substrates, although flexible plastic substrates are now being adopted, which are becoming increasingly important when utilized with roll-to-roll continuous manufacturing techniques. In addition to their use as light sources, OLEDs which are transparent (TOLEDs) have been proposed for integration into buildings and vehicles as smart-windows. Additionally, the control of electromagnetic radiation across a window may enable cost savings in terms of the heating and cooling of rooms. The integration of OLEDs and photovoltaic (PV) cells has also been proposed.

The manufacture and application of OLED light sources are now well known and a variety of architectures has been developed, for instance "bottom emission" and "top emission" designs. The bottom-emitting device comprises a transparent bottom substrate layer (traditionally glass) on which the OLED is fabricated, a transparent anode layer, a light-emitting organic layer, a reflective cathode and an encapsulating layer, in that order. The top-emitting device comprises a bottom substrate layer, a reflecting layer and an anode layer (or a reflecting anode layer), a light-emitting organic layer, a transparent cathode and an encapsulating layer, in that order. The OLEDs comprise at least one transparent electrode, for instance a transparent conductive oxide (TCO) such as indium tin oxide (ITO). ITO is commonly used in OLEDs because of its high transparency, thermal stability and conductivity. Conductive organic materials, alone or in combination with TCOs, are also now being investigated for use as transparent electrodes. One advantage of organic materials as electrodes is the ability to tune their refractive index either to match or intentionally mismatch the organic light-emitting layers.

With improvements in the efficiency of OLEDs, their utility for lighting applications has increased significantly. In order to achieve high power efficiencies of lighting devices with high colour quality and appropriate colour coordinates, electroluminescence has to be generated free of electrical and optical losses. Light extraction from a planar OLED design that consists of multiple thin organic and inorganic films is hampered by a combination of optical phenomena. Even if state-of-the-art OLED devices can achieve an internal quantum efficiency (IQE; photons generated per injected electron) approaching 100%, only about 50% of the photons generated will propagate into the substrate, and only around 20% of the photons generated will escape the OLED, the rest having been wave-guided and/or absorbed in the OLED stack and substrate. The resulting external quantum efficiency (EQE; photons emitted into air from the device per injected electron) from an optical point of view is therefore at most about 20% when using high efficiency (phosphorescent) materials. This value quickly drops by roughly a factor 4 when using less efficient (fluorescent) materials.

The term "wave-guiding" or "wave-guided" refers to the internal reflection of light within a layer and the refraction of light at layer boundaries, which occurs as a result of refractive index differences between adjacent layers, to which Snellius' law can be applied. Wave-guiding results in propagation of light parallel to the plane of the OLED. The refractive index of a glass substrate is around 1.5 whereas the light-emitting organic layers typically have refractive indices of about 1.7 to 1.9. Wave-guiding within the organic/inorganic thin film layer(s) and/or substrate of the stack means absorption losses become more significant. Due to high extinction coefficients of the functional materials of the various layers in the OLEDs, lateral wave-guiding in these functional layers has a length scale many orders of magnitude lower than in loss-free media, such as glass. With an efficiency target for OLED lighting towards 150 lm/W, the optical loss factors must be simultaneously reduced with the electrical losses and losses due to non-radiative recombination in the OLED stack. The improvement of light extraction from these devices is sometimes referred to as out-coupling. Current commercially available OLEDs have an efficiency of around 40 lm/W, although OLEDs with an efficiency of up to about 100 lm/W have been disclosed in the literature. This can be compared to about 15 lm/W for incandescent lighting and 60 to 100 lm/W for fluorescent lighting. In further contrast to incandescent lighting, fluorescent lighting, and inorganic LED-based lighting (for instance, AlGaInP devices and InGaN devices), an advantage of OLED-based lighting is that the OLED device itself may be the luminaire, rather than merely the light bulb in a luminaire, and so does not suffer from the fixture losses associated with such other light sources.

Thus, substrate wave-guiding can account for losses of up to about 30% of the total power emitted by a radiating dipole (depending on the design of the OLED), and a number of studies have addressed modification of the substrate in order to improve light extraction and increase the efficiency of the OLED. For instance, it is known to modify the topography of the external surface of the substrate by introducing periodic micro-structures of sufficient size with respect to the active area of the OLED, which increases the direct emission of light from the substrate, and such structures include micro-spheres, micro-pyramids and other micro-lens arrays (see, for instance, Greiner et al., Jap. J. Appl. Phys., 2007, 46 (7A), p4125; and Yang et al., Appl. Phys. Lett. 2010, 97, p223303). It is also known to dispose a volume-scattering layer containing light-scattering particles such as $TiO_2$ in an organic layer on the external surface of the OLED (Greiner et al., supra). Both approaches extract light from the substrate by redirecting the light via multiple reflections and require a high reflectance of the reflecting electrode to be effective. Further approaches involve the application of surface texturation or photonic crystals to the substrate (see Tyan et al., SID Digest, 2008, 39(1), p933). Such external extraction structures (EESs) have been shown to improve light output by as much as 60%. Internal extraction structures (IESs) have also been investigated in order to improve light extraction from wave-guided light within the organic and/or electrode layers of the OLED stack and the boundaries thereof, which can present different challenges because of the fragility of the organic stack and the potential for mechanical or chemical instability thereof. Studies have also been conducted which combine internal and external extraction structures in OLEDs (Vandersteegen et al., Light-Emitting Diodes: Research, Manufacturing and Applications XI; Eds. K. P. Streubel & H. Jeon; Proc of SPIE Vol. 6486, 64860H, 2007).

A further consideration is that it can be desirable for the light output of OLED lighting utilities to be viewing angle-independent, also referred to as a Lambertian output distribution. Thus, it can be desirable for optical properties such as emission intensity or emission colour not to deteriorate as the viewing angle changes from 0° (i.e. the normal direction; forward emission) through to 90°. The applicant's co-pending international application no. PCT/GB2013/053276 addresses the problem of angular variations in colour and intensity and provides an out-coupling film which provides a more homogeneous emission colour and/or emission intensity over the entire viewing angle range. In other OLED lighting utilities it can be desirable to increase the directionality of light output (typically in the normal direction, which is typically the direction of maximum light output efficiency) without detriment to the total light output efficiency of the device.

SUMMARY OF THE INVENTION

It is an object of this invention to further increase the external extraction efficiency of an OLED light source in order to increase the power, efficiency, lifetime and brightness of the device. It is a further object of this invention to increase the external extraction efficiency of an OLED in an efficient and cost-effective manner.

It is a further object of this invention to modulate the directionality of light emissions from an OLED, and in particular to improve the maximum light output efficiency at an angle perpendicular to the surface of the OLED (or "head-on brightness (HOB)"), and in particular to improve the maximum light output efficiency (HOB) simultaneously with the total light output efficiency of the OLED.

BRIEF DESCRIPTION OF THE DRAWINGS

FIG. 13b shows the total light output efficiency for each of three specific assemblies selected from the OLEDs used in FIG. 13a.

FIG. 14a shows the maximum light output efficiency of the series of OLEDs used in FIG. 13a.

FIG. 14b shows the maximum light output efficiency for each of three specific assemblies selected from the OLEDs used in FIG. 13a.

FIG. 15b shows the total light output efficiency for each of three specific assemblies selected from the OLEDs used in FIG. 15a.

FIG. 16a shows the maximum light output efficiency of the series of OLEDs used in FIG. 15a.

FIG. 16b shows the maximum light output efficiency for each of three specific assemblies selected from the OLEDs used in FIG. 15a.

DETAILED DESCRIPTION OF THE INVENTION

Figure 1:
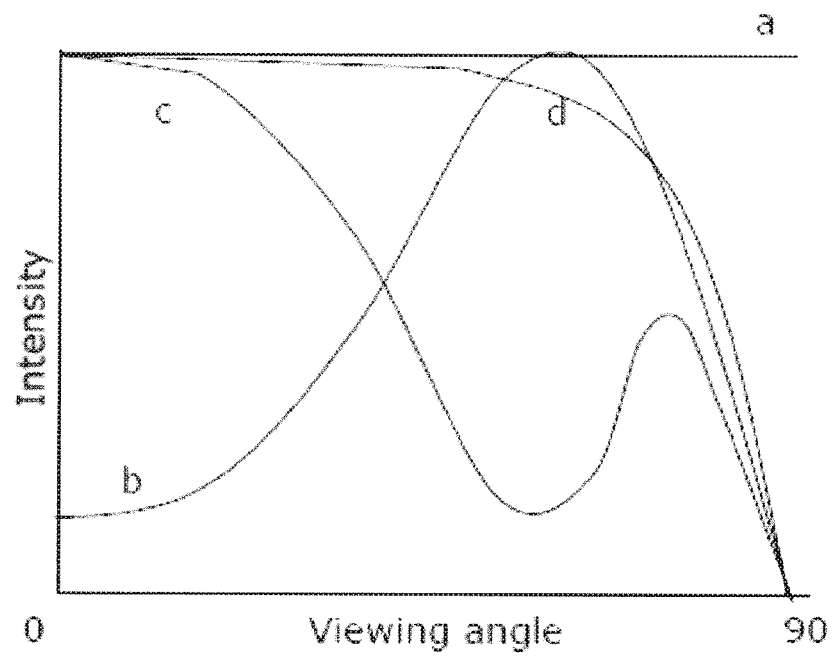
FIG. 1 shows a comparison of the normalised angle-dependence of light emitted from a non-Lambertian OLED with that of a Lambertian emitter.

It is a particular object of the invention to achieve the above-noted improvements in light extraction while retaining the mechanical integrity, functionality and efficiency of manufacture of the layers in an OLED.

According to the present invention, there is provided an OLED light source, comprising the following layers, in order:
- (i) a biaxially oriented polyester film substrate comprising light-scattering particles (P1);
- (ii) optionally an organic planarising coating layer (OPC1);
- (iii) optionally a barrier layer (B1);
- (iv) an organic planarising coating layer (OPC2) comprising light-scattering particles (P2);
- (v) optionally a barrier layer (B2); and
- (vi) a multi-layer light-emitting assembly comprising a first electrode, a light-emitting organic layer and a second electrode;

wherein said OLED light source comprises at least one of barriers layer (B1) and (B2).

The OLEDs used in the present invention exhibit excellent out-coupling performance with significant increases in external extraction efficiency. The OLEDs of the present invention embody two distinct modes of out-coupling, derived from an internal extraction structure (IES) and an external extraction structure (EES), to improve light extraction. The two extraction structures are at different and distinct locations in the OLED stack. OLEDs according to the present invention exhibit improved light extraction relative to OLEDs which contain only one of the extraction structures.

The inventors have unexpectedly found that the major contribution to the improvement in extraction efficiency is provided by the presence of light-scattering particles in the polyester film substrate. Given that the presence of scattering particles in the OPC2 planarising layer functions to redirect light into the escape cone at internal interfaces, it would have been expected that such redirection would have ensured a similar escape at the external OLED/air interface without a further change of direction (i,e, scattering) by particles in the substrate layer. The inventors have shown that low concentrations of scattering particles in both the substrate and OPC2 planarising layers provide a large improvement in extraction efficiency, advantageously allowing relatively low concentrations of scattering particles in the OPC2 layer. Thus, a relatively low concentration of scattering particles in the OPC2 layer of relatively low haze is sufficient to direct the optimum amount of light into the polyester substrate layer. Since the OPC2 layer would typically also contain a relatively high concentration of non-light-scattering particles in order to modulate the refractive index of the layer, the low concentration of scattering particles in the OPC2 layer allows retention of the mechanical integrity and functionality of the layer.

A further advantage of the dual location out-coupling approach is that it provides more flexibility in controlling the nature of the emitted light. The inventors have unexpectedly found that scattering at two positions in the assembly (i.e. each of the two layers making up the IES and EES respectively) is needed to produce the greatest value of maximum light output efficiency (HOB). In particular, the inventors have unexpectedly found that modulation of the directionality of emitted light is achieved uniquely by scattering in the polyester substrate layer. The inventors have found that while scattering in the internal OPC2 layer improves light extraction, the light emitted from the OLED is spread to higher angles. On the other hand, scattering in the polyester substrate layer reinstates a Lambertian emission profile or improves the maximum light output efficiency (HOB).

A particular advantage of the present invention is that it allows both the maximum light output efficiency (or HOB) and the total light output efficiency of the emission from the OLED to be maximised simultaneously, which the inventors have found is only possible by combining the internal and external extraction structures described herein. The present invention therefore allows light extraction efficiency to be improved while retaining the concentration of scattering and non-scattering particles in the OPC2 layer within workable and practicable levels, thereby retaining the mechanical integrity and coatability of the layer itself as well as its ability to planarise an underlying surface.

A further advantage of the present invention is that it allows a polymeric film not only to function as the substrate on which the OLED is fabricated but also to provide improved out-coupling. The present invention therefore increases the simplicity, and hence the efficiency and economy, of the fabrication process.

The OLED light-source of the present invention is a bottom-emitting device, as described herein.

The OLED light-source is preferably a flexible device.

The internal layers in the OLED light source of the present invention are selected to minimise the refractive index (RI) difference between the materials of adjacent layers in order to maximise extraction efficiency, as is known in the art. The refractive indices of the barrier layer(s) and the organic planarising coating layer(s) are preferably selected to match to the RIs of the multi-layer light-emitting assembly, and preferably each of the barrier layer(s) and organic planarising coating layer(s) are independently selected to exhibit an RI from about 1.70 to about 1.90, preferably about 1.75 to about 1.85, typically from about 1.78 to about 1.82. Preferably the RIs of each of the barrier layer(s) and the organic planarising coating layer(s) are within ±5%, preferably ±3%, preferably ±2% and preferably ±1% of each other, and are preferably the same. The RI of the polyester film substrate is typically in the range of from about 1.45 to about 1.80. The RI of the polyester film substrate and the organic planarising coating layer(s), in particular, may be modulated by varying the composition of the layer, for instance by the addition of non-light-scattering particles as discussed in more detail hereinbelow.

The Multi-layer Light-emitting Assembly

As noted above, OLED light sources can have a variety of different architectures and comprise electrode layers and one or more organic light-emitting layer(s). The organic light-emitting layer(s) is/are disposed between the electrode layers.

At least one of the electrodes is transparent, or both electrodes are transparent. A transparent electrode may comprise a transparent conductive oxide (TCO) and/or a conductive organic material. In a preferred embodiment, a transparent electrode (preferably the anode) comprises a layer of conductive organic material, optionally in association with a TCO layer. However, it is preferred that a transparent electrode comprises a layer of conductive organic material in the absence of a TCO layer. Suitable conductive organic materials include poly(3,4-ethylenedioxythiophene)/poly(styrene sulfonate) (PEDOT/PSS), commercially available as Orgacon™ conductive polymers (Agfa Materials). One of the electrodes (typically the cathode) may be a reflective electrode, and such electrodes are conventional in the art and include, for instance barium/silver or barium/aluminium layers or other combinations involving a material beneficial to electron injection, such as LiF, NaF, CsF, $Cs_2CO_3$, metal oxides or the like.

The organic light-emitting layer(s) is an organic material capable of emitting light when a current is passed between the anode and cathode between which the organic light-emitting layer(s) is/are disposed. The organic light-emitting layer(s) may be selected from any organic light-emitting layer suitable for use in OLEDs, for instance those described in the patent and academic literature. Preferably, organic light-emitting layer comprises a phosphorescent emissive material, although fluorescent emissive materials may also be used. Phosphorescent materials are generally preferred because of the higher luminescent efficiencies associated with such materials. An organic light-emitting layer may include a plurality of emissive materials capable of, in combination, emitting a desired spectrum of light. Examples of phosphorescent emissive materials include $Ir(ppy)_3$ (fac tris(2-phenylpyridine) iridium). Examples of fluorescent emissive materials include DCM (4-(dicyanomethylene)-2-methyl-6-(dimethylaminostyryl)-4H-pyran) and DMQA (N,N'-Dimethylquinacridone). Examples are disclosed in, for instance, U.S. Pat. No. 6,303,238.

The multi-layer light-emitting assembly suitably further comprises additional layers, such as an electron transport layer and a hole transport layer, as is known and conventional in the art. Thus, an electron transport layer is suitably disposed between the cathode and the organic light-emitting layer, and a hole transport layer is suitably disposed between the anode and the organic light-emitting layer. The electron transport and hole transport layers comprise any suitable material capable of transporting electrons and holes, respectively, and suitable materials are widely disclosed in the literature. Doping may be used to enhance conductivity thereof.

The Polyester Film Substrate

The substrate of the OLED of the present invention is a polyester film comprising light-scattering particles. The polyester substrate provides flexibility to the OLED light source and hence provides advantages over traditional glass substrates. However, because of the higher permeability of polyester relative to glass, the use of a polyester substrate requires additional barrier layers to prevent ingress of air or moisture into the OLED in order to protect the sensitive organic light-emitting stack. In addition, because the substrate is the base layer on which the OLED is assembled and fabricated, the polyester substrate is required to exhibit high dimensional stability because of the relatively higher temperatures during manufacture of the OLED.

The polyester film substrate is a self-supporting film or sheet by which is meant a film or sheet capable of independent existence in the absence of a supporting base.

The polyester of said polyester film substrate is preferably polyethylene terephthalate (PET) or polyethylene naphthalate (PEN), and more preferably polyethylene naphthalate. The polyethylene naphthalate is preferably derived from 2,6-naphthalenedicarboxylic acid. The polyester may also contain relatively minor amounts of one or more residues derived from other dicarboxylic acids and/or diols. Other dicarboxylic acids include isophathalic acid, phthalic acid, 1,4-, 2,5-, 2,6- or 2,7-naphthalenedicarboxylic acid, 4,4'-diphenyldicarboxylic acid, hexahydro-terephthalic acid, 1,10-decanedicarboxylic acid and aliphatic dicarboxylic acids of the general formula $C_nH_{2n}(COOH)_2$ wherein n is 2 to 8, such as succinic acid, glutaric acid sebacic acid, adipic acid, azelaic acid, suberic acid or pimelic acid. Other diols include aliphatic and cycloaliphatic glycols, such as 1,4-cyclohexanedimethanol. Preferably the polyester film substrate contains only one dicarboxylic acid, i.e. terephthalic acid or naphthalenedicarboxylic acid, and preferably naphthalenedicarboxylic acid. Preferably the polyester contains only one glycol, i.e. ethylene glycol. The polyester resin is the major component of the film, and makes up at least 50%, preferably at least 65%, preferably at least 80%, preferably at least 90%, and preferably at least 95% by weight of the total weight of the film.

The intrinsic viscosity of the polyester from which the polyester film substrate is manufactured is preferably at least about 0.65, preferably at least about 0.70, preferably at least about 0.75 and preferably at least about 0.80.

Formation of the polyester is conveniently effected in a known manner by condensation or ester interchange, generally at temperatures up to about 295° C. Solid state polymerisation may be used to increase the intrinsic viscosity to the desired value, using conventional techniques well-known in the art, for instance using a fluidised bed such as a nitrogen fluidised bed or a vacuum fluidised bed using a rotary vacuum drier.

The polyester film substrate comprises light-scattering particles (P1) which increase the degree of internal scattering of the polyester film, but without significant reduction in the total light transmittance of the film. The particles (P1) may be non-voiding inorganic particles, voiding inorganic particles or incompatible resin filler particles. Examples of inorganic particles which do not give rise to voiding in polyester film are metal or metalloid oxides, such as alumina, silica (especially precipitated or diatomaceous silica and silica gels) and titanium dioxide, and are preferably titanium dioxide particles or organic particles. An example of inorganic particles which give rise to voiding in polyester film is barium sulphate. Examples of incompatible resin filler particles are polyolefins, particularly polypropylene. Preferably, the light-scattering particles in the polyester film substrate comprise or consist of non-voiding inorganic particles. In a preferred embodiment, the light-scattering particles consist of non-voiding inorganic particles, preferably titanium dioxide particles. The titanium dioxide may be in anatase or rutile form.

The light-scattering particles (P1) are preferably present in an amount of from about 0.01 to about 1.0 vol %, preferably from about 0.05 to about 0.5 vol %, based on the total volume of said polyester film substrate. Preferably, the light scattering particles (P1) are present in an amount of no more than about 0.90 vol %, preferably no more than about 0.80 vol %, preferably no more than about 0.70 vol %, preferably no more than about 0.60 vol %, preferably no more than about 0.50 vol %, and preferably at least about 0.03 vol %, preferably at least about 0.05 vol %, preferably at least about 0.10 vol %. These concentration ranges are defined in relation to a polyester film substrate of thickness of 100 µm, wherein the concentration ranges according to the present invention for other film thicknesses are calculated on the basis of an inverse relationship to the thickness of the polyester film substrate, according to the formula:

$$V_T = V_{100}(100/T)$$

wherein:

$V_T$ is the particle concentration at a thickness T $V_{100}$ is the particle concentration as defined hereinabove in a polyester film substrate having a thickness of 100 μm.

Thus, for a polyester film substrate having a thickness of 200 μm, the light-scattering particles (P1) are preferably present in an amount of from about 0.005 to about 0.5 vol %, and so on in accordance with the preferred ranges noted above. Similarly, for a polyester film substrate having a thickness of 50 μm, the light-scattering particles (P1) are preferably present in an amount of from about 0.02 to about 2.0 vol %, and so on in accordance with the preferred ranges noted above. In this way, the number of scatter points in the optical path is maintained at the same level across the range of film thicknesses according to the present invention.

It will be appreciated that particle concentrations in wt % may be calculated from particle concentrations in vol % on the basis of the density of the materials (for instance, typical density values for $TiO_2$, PET and PEN are 4.23, 1.4 and 1.35 g/cm3, respectively).

Where the polyester film substrate comprises mixtures of the afore-mentioned different types of light-scattering particles, the relative proportions thereof may be adjusted to provide the required haze characteristics, as discussed hereinbelow. Preferably, the non-voiding inorganic particles make up greater than 50 vol % of the total amount of light-scattering particles in the polyester film substrate, and in one embodiment at least 60 vol %, in a further embodiment at least 70 vol %, in a further embodiment at least 80 vol %, in a further embodiment at least 90 vol %, in a further embodiment at least 95 vol %, and in a further embodiment at least 99 vol % of the light scattering particles in the polyester film substrate.

In a preferred embodiment, referred to herein as Embodiment A, the light-scattering particles are non-voiding inorganic particles.

In an alternative embodiment, referred to herein as Embodiment B, the light-scattering particles are voiding particles. Such voiding particles may be inorganic particles (Embodiment B1), or incompatible resin filler particles (Embodiment B2), or mixtures of voiding inorganic particles and incompatible resin filler particles (Embodiment B3). Where the scattering particles are voiding particles, the inorganic particles of Embodiment B1 are preferred.

In a further alternative embodiment, referred to herein as Embodiment C, the polyester film substrate comprises both non-voiding and voiding particles, as defined above. The particles may be non-voiding inorganic particles in combination with voiding inorganic particles (Embodiment C1 herein), but typically the non-voiding inorganic particles are in combination with the afore-mentioned voiding organic particles (Embodiment C2 herein). Less preferred is the combination of non-voiding inorganic particles with both voiding inorganic particles and incompatible resin filler particles (Embodiment C3).

The particle size of the light-scattering particles (P1) is preferably in the range of from about 150 nm to about 10,000 nm, preferably at least about 180 nm, more preferably at least about 200 nm, and preferably no more than about 1000 nm, preferably no more than about 500 nm, and preferably no more than about 300 nm. As used herein, the term "particle size" refers to the volume distributed median particle diameter (equivalent spherical diameter corresponding to 50% of the volume of all the particles, read on the cumulative distribution curve relating volume % to the diameter of the particles—often referred to as the "D(v,0.5)" value). Particle size is determined by scanning electron micrograph (SEM) images of sections of the manufactured film, which are subjected to image analysis to determine the distribution of sizes in situ. The median particle size may be determined by plotting a cumulative distribution curve representing the percentage of particle volume below chosen particle sizes and measuring the 50th percentile.

The polyester film substrate may comprise any other additive conventionally employed in the manufacture of polyester films. Thus, agents such as hydrolysis stabilisers, anti-oxidants, UV-stabilisers, cross-linking agents, dyes, lubricants, radical scavengers, thermal stabilisers, flame retardants and inhibitors, surface active agents, gloss improvers, prodegradents, viscosity modifiers and dispersion stabilisers may be incorporated as appropriate. Of particular utility in the present invention are hydrolysis stabilisers, anti-oxidants and UV-stabilisers, and suitable additives in this regard are disclosed in WO-2012/120260-A, the disclosure of which additives is incorporated herein by reference. Such components may be introduced into the polymer in a conventional manner. For example, by mixing with the monomeric reactants from which the film-forming polymer is derived, or the components may be mixed with the polymer by tumble or dry blending or by compounding in an extruder, followed by cooling and, usually, comminution into granules or chips. Masterbatching technology may also be employed.

Formation of the polyester film substrate may be effected by conventional extrusion techniques well-known in the art. In general terms the process comprises the steps of extruding a layer of molten polymer at a temperature within the range of from about 275 to about 300° C., quenching the extrudate and orienting the quenched extrudate. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the $T_g$ of the polyester, preferably about 15° C. higher than the $T_g$. It is not necessary to stretch equally in the machine and transverse directions although this is preferred if balanced properties are desired.

A stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction (TD) by a procedure known as "toe-in". Toe-in can involve dimensional shrinkage of the order 2 to 4% but an analogous dimensional relaxation in the process or machine direction (MD) is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. In one embodiment, the heat-set-temperature is within the range of from about 200 to about 225° C., which provides unexpected improvements in hydrolytic stability. After heat-setting the film is typically quenched rapidly in order induce the desired crystallinity of the polyester.

Preferably, the film is further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The polyester film substrate may be either a single layer or a composite structure comprising a plurality of polyester layers. Preferably the polyester film substrate is a single layer. Formation of a composite structure may be effected by co-extrusion, either by simultaneous coextrusion of the respective film-forming layers through independent orifices of a multi-orifice die, and thereafter uniting the still molten layers or, preferably, by single-channel coextrusion in which molten streams of the respective polymers are first united within a channel leading to a die manifold, and thereafter extruded together from the die orifice under conditions of streamline flow without intermixing thereby to produce a multi-layer film, which may be oriented and heat-set as hereinbefore described. The polyester layers of a composite film are selected from the polyesters described hereinabove, and preferably from PET or PET-based polyesters. Any or each layer in a composite film may comprise any of the additives mentioned above, wherein the additive(s) in a given layer may be the same as or different to the additive(s) in other layers, and in the same or different amounts. In one embodiment, the polyester film substrate comprises 2 or 3 layers, preferably having an AB or BAB layer structure. The respective layers may comprise the same or different type of polyester, but typically the same polyester is used in each layer of the composite film. The layers A and B may comprise different concentrations of light-scattering particles additive. In one embodiment, the scattering particles are in one layer only. For BAB layer structures where the light-scattering particles are present in the core (A) layer, the outer layers of the polyester film substrate suitably comprise particulate fillers (typically having a particle size in the range of from about 1.0 to about 5.0 µm, more typically from about 2.0 to about 4.0 µm) to improve handling and windability during manufacture, as is conventional in the art, and such particulate filler is suitably present in amounts not exceeding about 0.5% and preferably less than about 0.3% by total weight of the layer, and is suitably selected from silica and talc, preferably silica.

The thickness of the polyester film substrate is preferably in the range of from about 5 to about 500 µm, preferably at least about 25 µm, typically at least about 50 µm, and more preferably no more than about 250 µm, more preferably no more than about 150 µm.

The polyester film substrate is translucent or optically clear.

As defined herein, an optically clear film has a % of scattered visible light (haze) of no more than 30%, and/or a total luminous transmission (TLT) for light in the visible region (400 nm to 700 nm) of at least 80%, and preferably both. A translucent film has a TLT of at least 50%, preferably at least 60%, and preferably at least 70%.

The preferred polyester film substrates used in the present invention have high haze, preferably at least about 10%, preferably at least about 20%, preferably at least about 30%, preferably at least about 40%, preferably at least about 50% and in one embodiment at least about 60%. Preferably, haze is no more than about 96%, preferably no more than about 90%, and in one embodiment no more than about 86% or no more than about 80% or no more than about 75%.

Preferably, the polyester film substrates also have high TLT, preferably at least about 60%, preferably at least about 65%, preferably at least about 70%, preferably at least about 75%, preferably at least 80%, and more preferably at least about 85%.

The intrinsic viscosity of the polyester film substrate is preferably at least 0.65, preferably at least 0.7, and in one embodiment in the range of from about 0.65 to about 0.75. The use of polyester films with a relatively high intrinsic viscosity provides improved hydrolysis stability.

In one embodiment, the polyester of the polyester film substrate exhibits an endothermic high temperature peak at a temperature of (A) ° C. and an endothermic low temperature peak at a temperature of (B) ° C., both peaks being measured by differential scanning calorimetry (DSC), wherein the value of (A-B) is in the range from 15° C. to 50° C., preferably in the range from 15° C. to 45° C., more preferably in the range from 15° C. to 40° C., and in one embodiment in the range from 20° C. to 40° C., and this characteristic may be achieved as disclosed herein by control of the heat-setting temperature for the particular polyester being used. The advantage of exhibiting (A-B) values within the ranges disclosed herein is that a surprising improvement in hydrolytic stability is obtained.

The polyester film substrate preferably exhibits a low shrinkage, preferably less than 3% at 150° C. over 30 minutes, preferably less than 2%, preferably less than 1.5%, and preferably less than 1.0%, particularly in the machine (longitudinal dimension) of the film, and preferably such low shrinkage values are exhibited in both dimensions of the film (i.e. the longitudinal and transverse dimensions).

In a preferred embodiment, the internal surface of the polyester film substrate exhibits a relatively high surface roughness. The internal surface of the polyester film substrate is the surface of the substrate on which are disposed the internal functional layers of the OLED according to the present invention, as described hereinabove, i.e. the organic planarising layer(s), barrier layer(s) and the multi-layer light-emitting assembly.

Preferably, the internal surface of the polyester film substrate exhibits a surface roughness such that it affords the free-standing film an optical haze of at least 30%, preferably at least 50%, more preferably at least 60%, and preferably not greater than 96%, preferably not greater than 86% (i.e. measured in isolation and prior to application of the internal layers of the OLED described herein). Preferably, the internal surface of the polyester film substrate exhibits a Roughness Average (Ra) value of at least about 50 nm, preferably at least about 160 nm, preferably at least about 260 nm, and preferably no more than about 920 nm, preferably no more than about 660 nm, and preferably in the range of from about 300 nm to about 600 nm, and/or such that the Root Mean Square Roughness (Rq) value is at least about 50 nm, preferably at least about 200 nm, more preferably at least about 320 nm, and preferably no more than about 1300 nm, preferably no more than about 950 nm and preferably in the range of from about 400 nm to about 850 nm.

Surface roughness may be imparted by any suitable means but is preferably imparted by abrasive blasting of the surface of the polyester film substrate. Abrasive blasting is a conventional technique well-known in the art, characterised by the use of abrasive materials having typical particle dimensions of less than 50 µm, preferably less than 10 µm. Abrasive materials may be selected from, for instance, silica, sodium bicarbonate, alumina, chromium (Martensite), carbon and silicon carbide. A range of surface roughness on plastic surfaces may be achieved, depending on the hardness of the abrasive material and the conditions (temperature, pressure and time) of the abrasive blasting treatment. Suitable abrasive blasting equipment is commercially available, and includes, for instance, a Microstrip machine (Precision Blast Systems Ltd, UK). Such equipment may be operated in an enclosed environment (such as a glove-box).

An alternative route to imparting surface roughness is via the coating of the polyester film substrate, suitably by coating a formulation which comprises thermally cross-linkable binder and particles of dimension sufficient to scatter light, and typically also a surfactant, onto the internal surface of the polyester film substrate, typically wherein the thickness of the binder coating is less than the dimension of the particles, thereby creating a physically rough surface. In this embodiment, the particles and binder are selected that the refractive index of the coating layer matches that of the polyester film substrate in accordance with the principles described hereinabove in order to ensure that light scattering arises from the surface topography only.

Where the OLED comprises a polyester film substrate which has been roughened and/or exhibits a relatively high surface roughness on its internal surface and further comprises barrier layer (B1), there is disposed on the roughened surface of the substrate an organic planarising coating layer (OPC1), in order to present a smooth surface for deposition of the barrier layer (B1) to ensure the continuity and integrity thereof. The organic planarising coating layer (OPC1) is preferably derived from a composition comprising organic material independently selected from those described hereinbelow for the organic planarising coating layer (OPC2). The organic material of layers OPC1 and OPC2 may be the same or different, but are preferably the same in order to minimise RI differences between adjacent internal layers. The dry thickness of the organic planarising coating layer (OPC1) is preferably in the range of from about 2 µm to about 20 µm, preferably from about 2 µm to about 10 µm, and preferably from about 2 µm to about 5 µm. The organic planarising coating layer (OPC1) preferably further comprises non-light-scattering particles (P4) for the purpose of modulating the RI of the OPC1 layer. The identity, particle size and concentration of the non-light-scattering particles (P4) are independently selected from the same non-light-scattering particles (P3) (including the size and concentration parameters) described hereinbelow for the organic planarising coating (OPC2), The RI difference between the organic planarising coating layer (OPC1) and the barrier layer (B1) should be minimised as described hereinabove. The organic planarising coating layer (OPC1) does not comprise light-scattering particles. The OPC1 layer may be disposed onto the polyester film substrate in accordance with the method described hereinbelow for the OPC2 layer, and surface modification of the polyester film substrate may be effected as described hereinbelow for the OPC2 layer.

Organic planarising coating layer (OPC1) is preferably also present whenever barrier layer (B1) is present, and whether or not the internal surface of the polyester film substrate has been roughened.

Barrier Layers

The OLED may comprise a first barrier layer (B1) and/or a second barrier layer (B2), such that at least one of layer (B1) and layer (B2) are present in the OLED. The organic light-emitting layers are very sensitive to air and moisture. The barrier layer provides barrier properties to water vapour and/or oxygen transmission. Where present, barrier layer (B1) may be disposed on an unroughened polyester film substrate but where said substrate has been roughened and/or exhibits the surface roughness as described above then it is necessary to dispose organic planarising coating layer (OPC1) prior to application of the barrier layer (B1). Preferably, the OLED comprises barrier layer (B1) whether or not the internal surface of the polyester film substrate has been roughened.

A barrier layer is typically applied in a sputtering process at elevated temperatures, and may be organic or inorganic. A barrier layer can itself comprise one or more discrete layers, and may comprise one or more organic layer(s) and one or more inorganic layer(s). However, multi-layer arrangements, particularly of inorganic and organic layer combinations, are less preferred since they may increase wave-guiding and reduce extraction efficiency. Materials which are suitable for use to form a barrier layer are disclosed, for instance, in U.S. Pat. No. 6,198,217. Typical organic barrier layers include photocurable monomers or oligomers, or thermoplastic resins. Photocurable monomers or oligomers should have low volatility and high melting points. Examples of such monomers include trimethylol acrylates such as trimethylolpropane triacrylate, ditrimethylolpropane tetraacrylate and the like; long-chain acrylates such as 1,6-hexanediol diacrylate, 1,6-hexanediol dimethacrylate and the like; and cyclohexyl acrylates such as dicyclopentenyloxyethyl acrylate, dicyclopentenyloxy acrylate, cyclohexyl methacrylate and the like. Examples of such oligomers include acrylate oligomers, epoxy acrylate oligomers, urethane acrylate oligomers, ether acrylate oligomers, and the like. Photoinitiators, such as benzoin ethers, benzophenones, acetophenones, ketals and the like, may be used to cure the resin. Examples of suitable thermoplastic resins include polyethylene, polymethyl methacrylate, polyethylene terephthalate and the like. These organic materials are typically applied by vacuum deposition. Typical inorganic barrier layers are made of a material which exhibits low moisture permeability and is stable against moisture. Of particular interest are the oxides, nitrides and sulphides of Groups IVB, VB, VIB, IIIA, IIB, IVA, VA and VIA of the Periodic Table and combinations thereof. Examples include oxides such as $SiO_2$, SiO, GeO, $Al_2O_3$, ZnO, $ZrO_2$, $HfO_2$ and the like, nitrides such as AlN, TiN, $Si_3N_4$ and the like, and metals such as Al, Ag, Au, Pt, Ni and the like. Mixed oxide-nitrides may also be used. The inorganic material is usually applied using a vapour phase technique such as vacuum or plasma deposition, sputtering, atomic layer deposition (ALD) and the like under standard conditions. Barrier layers which exhibit optical transparency, such as the oxides noted above, and the nitrides of Si and Al, are of particular utility. Silicon nitride is preferred. A barrier layer which exhibits optical transparency is a barrier layer which, when deposited on an substrate, does not substantially decrease the TLT of that substrate, preferably wherein any decrease in TLT is no more than 10%, preferably no more than 5%, preferably no more than 2%, relative to the TLT value of that substrate prior to application of the barrier layer. The refractive index of the barrier layer may be modified or tuned by appropriate doping through co-deposition, without significant effect on its barrier performance, as disclosed for instance in U.S. Pat. No. 8,227,984 and EP-2304069-A.

The thickness of the barrier layer is preferably in the range of from about 2 nm to about 200 nm, more preferably from about 10 to about 150 nm, and preferably from about 50 to about 120 nm. Thinner layers are more tolerant to flexing without causing the film to crack, which is an important property of flexible substrates in OLED light sources since cracking compromises barrier properties. Thinner barrier films are also more transparent.

Preferably, the assembly comprising (i) the polyester film substrate comprising light-scattering particles (P1); (ii) optional planarising coating layer (OPC1); (iii) optional barrier layer (B1); (iv) organic planarising coating layer (OPC2) comprising light-scattering particles (P2); and (v) optional barrier layer (B2), wherein at least one of said barrier layers (B1) and (B2) is present, exhibits a water vapour transmission rate of less than $10^{-3}$ g/m$^2$/day and/or an oxygen transmission rate of less than $10^{-3}$/mL/m$^2$/day. Preferably, the water vapour transmission rate is less than $10^{-4}$ g/m$^2$/day, preferably less than $10^{-5}$ g/m$^2$/day, preferably less than $10^{-6}$ g/m$^2$/day. Preferably, the oxygen transmission rate is less than $10^{-4}$ g/m$^2$/day, preferably less than $10^{-5}$ g/m$^2$/day.

The Organic Planarising Coating Layer (OPC2)

The function of the organic planarising coating layer (OPC2) is to reduce the roughness of the surface of the underlying layers in order to provide a smooth surface prior to application of the barrier layer (B2) or the multi-layer light-emitting assembly. The barrier layers described herein are relatively thin layers and should be deposited upon a smooth surface in order to avoid pinpricks or other imperfections therein, and hence to maximise barrier performance.

Suitable materials for organic planarising coatings are known in the art. For instance, suitable coatings are derived from compositions comprising polymerisable and cross-linkable monomeric compounds and/or polymerisable and cross-linkable oligomeric compounds (particularly unsaturated oligomeric compounds), and particularly wherein said compositions comprise polymerisable and cross-linkable monomeric acrylates and/or oligomeric acrylates. Thus, suitable coatings are derived from compositions comprising polymerisable and cross-linkable monomeric compounds and optionally further comprising polymerisable and cross-linkable oligomeric compounds (particularly unsaturated oligomeric compounds), and particularly wherein said compositions comprise polymerisable and cross-linkable monomeric acrylates and optionally further comprise oligomeric acrylates. The compositions suitably further comprise a thermal or photoinitiator. The compositions typically further comprise a solvent (e.g. methylethylketone). In a preferred embodiment, the coating is derived from a composition comprising:

(i) a polymerisable monomeric reactive diluent (e.g a monomeric acrylate); and/or
(ii) an unsaturated oligomer (e.g. acrylates, urethane acrylates, polyether acrylates, epoxy acrylates, melamine acrylates or polyester acrylates);
(iii) optionally a photoinitiator; and
(iv) optionally a solvent (e.g. methylethylketone).

It will be appreciated that the polymerisable monomeric species suitably has a low molecular weight; and that the term "reactive" signifies the polymerisability of the monomeric species.

Suitable organic planarising coatings include those which are curable by free radical reaction, initiated by a photolytic route. In one embodiment, the coating composition comprises a UV-curable mixture of monomeric and oligomeric acrylates (preferably comprising methylmethacrylate and ethylacrylate) in a solvent (such as methylethylketone), typically wherein the coating composition comprises the acrylates at about 20 to 30 wt % solids of the total weight of the composition, and further comprising a minor amount (e.g. about 1% by weight of the solids) of photoinitiator (e.g. Irgacure™ 2959; Ciba). In a further embodiment, a UV-curable coating composition comprises monomeric acrylates (typically multi-functional acrylates) in a solvent (such as methylethylketone), typically wherein the coating composition comprises the acrylates at about 5 to 50 wt % solids of the total weight of the coating composition, and further comprising a minor amount (e.g. about 1% by weight of the solids) of photoinitiator. Multi-functional monomeric acrylates are known in the art, and examples include dipentaerythritol tetraacrylate and tris(2-acryloyloxyethyl) isocyanurate.

Suitable thermally curable organic planarising coating compositions also include compositions comprising monomeric acrylates and/or oligomeric acrylates and optionally a thermal initiator, as are known in the art.

In a further embodiment, a thermally-curable organic planarising coating composition comprises an epoxy resin. Other organic materials suitable for use as an organic planarising coating include crosslinkable organic polymers, such as polyether imine (PEI), polyester, polyvinyl alcohol, polyamide, cured by a thermal or photo-crosslinking agent.

Suitable thermal initiators include methyl ethyl ketone peroxide, azobis isobutyronitrile, dicumyl peroxide and benzoyl peroxide.

Examples of curable coatings suitable for application to plastic surfaces include aliphatic urethane diacrylates, aliphatic urethane tetraacrylates and aliphatic urethane hexaacrylates, for instance those commercially available as grades CN966J75, CN9276 and CN901OEU from Sartomer®.

A suitable high RI organic planarising coating composition comprises an acrylate oligomer (CN890; Sartomer) and monomeric acrylate in approximately equal parts, further comprises 4 wt % (based on total acrylate solids) of peroxide thermal initiator, and further comprises $TiO_2$ nanoparticles (non-light-scattering; PL-TiO2-P25 from Plasma Chem GmbH) to a concentration of about 80 wt % in the final composition. Light scattering particles (P2) are utilised in the layer as described herein. The coating composition is thermally curable (for instance, by heating at 200° C. for 2 minutes) after application to the film surface. After curing, the composition provides a coating layer having a refractive index 1.8.

Prior to application of the organic planarising coating (OPC2), the exposed surface of the polyester film substrate may be subjected to a chemical or physical surface-modifying treatment to improve the bond between that surface and the subsequently applied coating, as disclosed in the applicant's co-pending international application no. PCT/GB2013/053276, the disclosure of which surface-modifying treatment is incorporated herein by reference. A preferred treatment is to subject the exposed surface of the film to a high voltage electrical stress accompanied by corona discharge. Alternatively or additionally, the polyester film substrate may be coated with a primer layer, which may be any suitable adhesion-promoting polymeric composition known in the art, including polyester and acrylic resins.

The light-scattering particles (P2) in the organic planarising coating layer (OPC2) are preferably selected from the light-scattering particles (P1) described hereinabove for the polyester film substrate, and may be the same or different from the particles (P1). Preferably, the particles (P2) are selected from non-voiding inorganic particles, preferably from titanium oxide The light-scattering particles (P2) are preferably present in the organic planarising layer (OPC2) in an amount of from about 0.01 to about 1.0 vol %, preferably from about 0.05 to about 0.5 vol %, based on the total volume of the layer. Preferably, the light scattering particles (P2) are present in an amount of at least about 0.03 vol %, preferably at least about 0.05 vol %, preferably at least about 0.10 vol %. Preferably, the light scattering particles (P2) are present in an amount of no more than about 0.90 vol %, preferably no more than about 0.80 vol %, preferably no more than about 0.70 vol %, preferably no more than about 0.60 vol %, preferably no more than about 0.50 vol % in order to retain the integrity of the organic planarising layer (OPC2), as well as to avoid compromising the barrier properties of a subsequently applied barrier layer (B2). These concentration ranges are defined in relation to an organic planarising layer (OPC2) of thickness of 20 μm, wherein the concentration ranges according to the present invention for other layer thicknesses are calculated on the basis of an inverse relationship to the thickness of the layer, according to the formula:

$$V_T = V_{20}(20/T)$$

wherein:

$V_T$ is the particle concentration at a thickness T $V_{20}$ is the particle concentration as defined hereinabove in an organic planarising layer (OPC2) having a thickness of 20 μm.

In one embodiment, the light-scattering particles (P2) are present in the organic planarising layer (OPC2) in the same or substantially the same concentration as the concentration as the light-scattering particles (P1) are present in the polyester film substrate layer. As used herein, the term "substantially the same concentration" means that a first concentration value not greater or less than 10% of a second concentration value, preferably not greater or less than 5%.

The particles (P2) preferably exhibit a size in the range of from about 150 nm to about 10,000 nm, preferably at least about 180 nm, more preferably at least about 200 nm, preferably at least about 250 nm, and preferably no more than about 1000 nm, preferably no more than about 500 nm, and preferably no more than about 300 nm.

The organic planarising layer (OPC2) typically further comprises non-light-scattering particles (P3) which are included for the purpose of modulating the refractive index (RI) of the layer, and in particular to increase the RI of the layer so that it matches the RI of the barrier layer(s) and the multi-layer light-emitting assembly. The non-light-scattering particles (P3) suitably have a particle size of no more than 100 nm and may be present in amounts of up to about 80 wt %, based on the total weight of the layer. Particle size is preferably determined by transmission electron micrograph (TEM) and otherwise as described herein. The non-light-scattering particles (P3) may be selected from any suitable particles known in the art for this purpose, and are preferably selected from $TiO_2$ and $ZrO_2$, preferably from $TiO_2$.

The organic planarising coating layer (OPC2) may be applied by any suitable or conventional coating technique, such as gravure roll coating, reverse roll coating, dip coating, bead coating, slot coating or electrostatic spray coating. The coatings can be applied either "off-line" as a process step distinct from the film manufacture, or "in-line" as a continuation of the film manufacturing process.

The dry thickness of the organic planarising coating layer (OPC2) is preferably from about 0.5 to about 50 μm, preferably from about 2 to 30 microns, and particularly from about 5 to about 20 microns.

Scratch-resistant Coating

In a preferred embodiment, the external surface of the polyester film substrate has disposed thereon a scratch-resistant coating (or hardcoat), in order to protect the OLED from mechanical damage. A polyester film substrate comprising a scratch-resistant coating is disposed in the OLED such that the external surface of the OLED is the scratch-resistant coating.

The scratch-resistant layer provides mechanical protection to the film, as judged for example by the Taber abraser test (ASTM Method D-1044) in which the haze on the test samples is determined by ASTM Method D-1003. The Taber Abrasion test will typically cause controlled damage to the surface of unprotected film such that under the standard conditions of treatment, the haze of the film is seen to increase by 40-50%.

Suitable scratch-resistant coatings are disclosed in the applicant's co-pending international application no. PCT/GB2013/053276, the disclosure of which scratch-resistant coatings are incorporated herein by reference. Thus, preferred scratch-resistant coatings used in the present invention fall broadly into one of the three following classifications; organic, organic/inorganic hybrid and predominantly inorganic coats. A predominantly inorganic scratch-resistant coating comprises inorganic particles which are contained in a polymerisable predominantly inorganic matrix such as a polysiloxane. Other examples of a suitable scratch-resistant layer are disclosed in, for instance, U.S. Pat. Nos. 4,198,465, 3,708,225, 4,177,315, 4,309,319, 4,436,851, 4,455,205, 0142362, WO-A-03/087247 and EP 1418197 the disclosures of which are incorporated herein by reference. In a further embodiment, the coating composition comprises a cross-linkable organic polymer, for instance a polyethylene imine (PEI), polyester or polvinylalcohol (PVOH), and a crosslinking agent, in a solvent (typically an aqueous solvent). Prior to application of a scratch-resistant coating, the exposed (external) surface of the polyester film substrate may be subjected to a surface-modifying treatment to improve the bond between that surface and the subsequently applied coating, as described hereinabove.

The scratch-resistant layer typically has the effect of planarising the surface of the polyester film substrate, the natural surface roughness of which varies as a result of the particulate content, polymer identity and manufacturing history of the film. Many of the conventional approaches to out-coupling have involved the provision of a roughened external surface to improve light extraction from OLED light sources. The present invention achieves scratch-resistance using a planarising coating without detriment to light extraction. The surface of the scratch-resistant coating preferably exhibits a surface having an Ra value, as measured herein, of less than 0.7 nm, preferably less than 0.6 nm, preferably less than 0.5 nm, preferably less than 0.4 nm, preferably less than 0.3 nm, and ideally less than 0.25 nm, and/or an Rq value, as measured herein, of less than 0.9 nm, preferably less than 0.8 nm, preferably less than 0.75 nm, preferably less than 0.65 nm, preferably less than 0.6 nm, preferably less than 0.50 nm, preferably 0.45 nm or lower, preferably less than 0.35 nm, and ideally less than 0.3 nm.

The scratch-resistant layer may result in an increase in the haze of the polyester film substrate, and this increase is preferably no more than 20%, more preferably no more than 10% and most preferably no more than 5% of the haze value of the polyester film substrate in the absence of the scratch-resistant layer. The scratch-resistant layer may also result in a decrease in the TLT of the polyester film substrate and this decrease is preferably no more than 20%, more preferably no more than 10% and most preferably no more than 5% of the TLT value of the polyester film substrate in the absence of the scratch-resistant layer. Surprisingly, the scratch-resistant coating of the present does not adversely affect the extraction efficiency or the angular dependence of emitted light of the OLED.

The OLED Light Source

The OLEDs of the present invention exhibit excellent and improved extraction efficiency.

The assembly comprising (i) the polyester film substrate comprising light-scattering particles (P1); (ii) optional organic planarising coating layer (OPC1); (iii) optional barrier layer (B1); (iv) organic planarising coating layer (OPC2) comprising light-scattering particles (P2); and (v) optional barrier layer (B2), wherein at least one of said barrier layers is present, preferably exhibits:
  (1) a haze of at least about 50% preferably at least about 60%, preferably at least about 70%, preferably at least about 80%, and typically no more than about 95%, more typically no more than about 90%; and/or
  (2) a TLT of at least about 60%, preferably at least about 65%, preferably at least about 70%, preferably at least about 75%, preferably at least 80%, and more preferably at least about 85%.

The OLED light sources of the present invention suitably comprise an encapsulating layer over the multi-layer light-emitting assembly (i.e. on the surface of the second electrode remote from the light-emitting organic layer, or on the surface of the multi-layer light-emitting assembly which is in closest proximity to the second electrode), as is known in the art, for the purpose of protecting it from air and moisture ingress.

According to a further aspect of the invention, there is provided a method for fabricating an OLED light-source as described herein comprising the steps of:
(i) providing a polyester film substrate comprising light-scattering particles (P1);
(ii) optionally disposing an organic planarising coating layer (OPC1) on a surface of said polyester film substrate;
(iii) optionally disposing a barrier layer (B1) on a surface of said polyester film substrate or, where present, on the surface of the organic planarising coating layer (OPC1);
(iv) disposing an organic planarising coating layer (OPC2) comprising light-scattering particles (P2) on a surface of the polyester film substrate or on the surface of the barrier layer (B1) where the barrier layer (B1) is present;
(v) optionally disposing a barrier layer (B2) on the surface of the organic planarising coating layer (OPC2); and
(vi) disposing a multi-layer light-emitting assembly comprising a first electrode, a light-emitting organic layer and a second electrode on a surface of the organic planarising coating layer (OPC2) or on the surface of the barrier layer (B2) where the barrier layer (B2) is present, wherein step (vi) may be a multi-step process;
and wherein said process comprises at least one of steps (iii) and (v).

According to a further aspect of the present invention, there is provided a method of modulating the directionality of emitted light from an OLED light source comprising a substrate and a multi-layer light-emitting assembly comprising a first electrode, a light-emitting organic layer and a second electrode, said method comprising
(i) providing a biaxially oriented polyester film comprising light-scattering particles (P1) as said substrate of said OLED;
(ii) optionally disposing an organic planarising coating layer (OPC1) on a surface of said polyester film substrate;
(iii) optionally disposing a barrier layer (B1) on a surface of said polyester film substrate or, where present, on the surface of the organic planarising coating layer (OPC1);
(iv) disposing an organic planarising coating layer (OPC2) comprising light-scattering particles (P2) on a surface of the polyester film substrate or on the surface of the barrier layer (B1) where the barrier layer (B1) is present;
(v) optionally disposing a barrier layer (B2) on the surface of the organic planarising coating layer (OPC2); and
(vi) disposing a multi-layer light-emitting assembly comprising a first electrode, a light-emitting organic layer and a second electrode on a surface of the organic planarising coating layer (OPC2) or on the surface of the barrier layer (B2) where the barrier layer (B2) is present, wherein step (vi) may be a multi-step process;
and wherein said process comprises at least one of steps (iii) and (v).

In said methods of the present invention, the OLED light source and features thereof are as described herein.

The methods of the present invention suitably comprise the steps of providing a first electrode, providing a light-emitting organic layer and providing a second electrode. The methods of the present invention suitably further comprise the step of providing an encapsulating layer over the multi-layer light-emitting assembly, as is known in the art, for the purpose of protecting it from air and moisture ingress.

The methods preferably comprise the step of imparting surface roughness to the internal surface of the polyester film substrate by abrasion blasting the surface of the polyester film substrate, as described herein.

As described above, the methods may comprise the step of disposing organic planarising coating layer (OPC1) on a surface of said polyester film substrate in embodiments wherein the internal surface of the polyester film substrate has been roughened and/or exhibits relatively high surface roughness and barrier layer (B1) is present. The methods may also comprise the step of disposing organic planarising coating layer (OPC1) on a surface of said polyester film substrate whenever barrier layer (B1) is present, whether or not the internal surface of the polyester film substrate has been roughened.

According to a further aspect of the present invention, there is provided the use of a biaxially oriented polyester film comprising light-scattering particles (P1) to modulate the directionality of emitted light from an OLED light source, wherein said OLED light source comprises the following layers, in order:
(i) a biaxially oriented polyester film substrate comprising light-scattering particles (P1);
(ii) optionally an organic planarising coating (OPC1) layer;
(iii) optionally a barrier layer (B1);
(iv) an organic planarising coating layer (OPC2) comprising light-scattering particles (P2);
(v) optionally a barrier layer (B2); and
(vi) a multi-layer light-emitting assembly comprising a first electrode, a light-emitting organic layer and a second electrode;
wherein said OLED light source comprises at least one of barrier layers (B1) and (B2).

According to a further aspect of the present invention, there is provided the use of light-scattering particles to modulate the directionality of emitted light from an OLED light source, wherein said light-scattering particles are disposed in an OLED light source comprising the following layers in order:
(i) a biaxially oriented polyester film substrate comprising light-scattering particles (P1);
(ii) optionally an organic planarising coating (OPC1) layer;
(iii) optionally a barrier layer (B1);
(iv) an organic planarising coating layer (OPC2) comprising light-scattering particles (P2);
(v) optionally a barrier layer (B2); and
(vi) a multi-layer light-emitting assembly comprising a first electrode, a light-emitting organic layer and a second electrode;
wherein said OLED light source comprises at least one of barrier layers (B1) and (B2).

In said uses of the present invention, the OLED light source and features thereof are as described herein. For instance, the OLED light source suitably further comprises an encapsulating layer over the multi-layer light-emitting assembly, as is known in the art and described herein, for the purpose of protecting it from air and moisture ingress.

As used herein, the term "the directionality of emitted light" of the OLED light source refers to the angular dependence of emitted light as measured by the maximum light output efficiency (HOB), and in particular as measured by both the maximum light output efficiency (HOB) and the total light output efficiency. The term "modulate the directionality of emitted light" refers to increasing or maximising the maximum light output efficiency (HOB), and preferably simultaneously increasing or maximising the total light output efficiency, relative to an OLED light source which does not have the light-scattering particle profile according to the present invention. In particular, the term "modulate the directionality of emitted light" refers to increasing the maximum light output efficiency (HOB), while simultaneously increasing, maintaining or maximising the total light output efficiency, relative to an OLED light source which does not have the light-scattering particle profile according to the present invention.

Property Measurement

The following analyses were used to characterize the OLEDs described herein:

(i) The concentration of particles in a layer, also referred to as "inorganic loading", may be measured using gravimetric means. A specimen of material is firstly weighed, then pyrolysed, and the residual mass reweighed. The pyrolysis treatment involves heating a sample of known mass from 330° C. to 500° C. and holding at temperature overnight. The mass of the residual inorganic filler is then expressed as a weight percentage (wt %) of that of the initial sample.

(ii) Clarity was evaluated by measuring total luminance transmission (TLT) and haze (% of scattered transmitted visible light) through the total thickness of the film using a Haze-gard plus spherical hazemeter (BYK Gardner) according to the standard test method ASTM D1003. This test method was used herein to record haze values up to 100%.

(iii) Intrinsic viscosity (in units of dL/g) was measured by solution viscometry in accordance with ASTM D5225-98 (2003) on a Viscotek™ Y-501C Relative Viscometer (see, for instance, Hitchcock, Hammons & Yau in American Laboratory (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln \eta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(iv) Thermal shrinkage was assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.

(v) Differential scanning calorimeter (DSC) scans were obtained using a Perkin Elmer DSC 7 instrument. Polyester film samples weighing 5 mg were encapsulated into a standard Perkin Elmer aluminium DSC crucible. The film and crucible were pressed flat to ensure that the film was partially constrained in order to minimise effects of relaxation of orientation during heating. The specimen was placed in the sample holder of the instrument and heated at 80° C. per minute from 30 to 300° C. to record the relevant trace. A dry, inert purge gas (nitrogen) was used. The temperature and heat flow axis of the DSC instrument were fully calibrated for the experimental conditions, i.e. for the heating rate and gas flow rate. The values for the peak temperatures, i.e. the endothermic high temperature peak (A) and endothermic low temperature peak (B), were taken as the maximum displacement above a baseline drawn from the onset of each endothermic melting process to the end of each endothermic melting process. Peak temperature measurements were derived using standard analysis procedures within the Perkin Elmer software. Precision and accuracy of the measurements was ±2° C.

(vi) Oxygen transmission rate is measured using ASTM D3985.

(vii) Water vapour transmission rate is measured using ASTM F1249.

(viii) Surface Smoothness is measured using conventional non-contacting, white-light, phase-shifting interferometry techniques, which are well-known in the art, using a Wyko NT3300 surface profiler using a light source of wavelength 604 nm. With reference to the WYKO Surface Profiler Technical Reference Manual (Veeco Process Metrology, Arizona, US; June 1998; the disclosure of which is incorporated herein by reference), the characterising data obtainable using the technique include:

Averaging Parameter—Roughness Average (Ra): the arithmetic average of the absolute values of the measured height deviations within the evaluation area and measured from the mean surface.

Averaging Parameter—Root Mean Square Roughness (Rq): the root mean square average of the measured height deviations within the evaluation area and measured from the mean surface.

Extreme Value Parameter—Maximum Profile Peak Height (Rp): the height of the highest peak in the evaluation area, as measured from the mean surface.

Averaged Extreme Value Parameter—Average Maximum Profile Peak Height (Rpm): the arithmetic average value of the ten highest peaks in the evaluation area.

Extreme Peak Height Distribution: a number distribution of the values of Rp of height greater than 200 nm.

Surface Area Index: a measure of the relative flatness of a surface.

The roughness parameters and peak heights are measured relative to the average level of the sample surface area, or "mean surface", in accordance with conventional techniques. (A polymeric film surface may not be perfectly flat, and often has gentle undulations across its surface. The mean surface is a plane that runs centrally through undulations and surface height departures, dividing the profile such that there are equal volumes above and below the mean surface.)

The surface profile analysis is conducted by scanning discrete regions of the film surface within the "field of view" of the surface profiler instrument, which is the area scanned in a single measurement. A film sample may be analysed using a discrete field of view, or by scanning successive fields of view to form an array. The analyses conducted herein utilised the full resolution of the Wyko NT3300 surface profiler, in which each field of view comprises 480×736 pixels.

For the measurement of Ra and Rq, the resolution was enhanced using an objective lens having a 50-times magnification. The resultant field of view has dimensions of 90 μm×120 μm, with a pixel size of 0.163 μm.

For the measurement of Rp and Rpm, the field of view is conveniently increased using an objective lens having a 10-times magnification in combination with a "0.5-times field of view of multiplier" to give a total magnification of 5-times. The resultant field of view has dimensions of 0.9 mm×1.2 mm, with a pixel size of 1.63 μm. Preferably Rp is less than 100 nm, more preferably less than 60 nm, more preferably less than 50 nm, more preferably less than 40 nm, more preferably less than 30 nm, and more preferably less than 20 nm.

For the measurement of Ra and Rq herein, the results of five successive scans over the same portion of the surface area are combined to give an average value. The Rp value is typically the average value from 100 measurements. Measurements are conducted using a modulation threshold (signal:noise ratio) of 10%, i.e. data points below the threshold are identified as bad data.

The surface topography can also be analysed for the presence of extreme peaks having a height of greater than 200 nm. In this analysis, a series of measurements of Rp are taken with a pixel size of 1.63 μm over a total area of 5 cm². The results may be presented in the form of a histogram in which the data-points are assigned to pre-determined ranges of peak heights, for instance wherein the histogram has equally-spaced channels along the x-axis of channel width 25 nm. The histogram may be presented in the form of a graph of peak count (y axis) versus peak height (x axis). The number of surface peaks in the range 300 to 600 nm per 5 cm² area, as determined from Rp values, may be calculated, and designated as N(300-600). The coatings used in the present invention preferably result in a reduction of N(300-600) in the film, such that the reduction F, which is the ratio of N(300-600) without and with the coating, is at least 5, preferably at least 15, and more preferably at least 30. Preferably, the N(300-600) value of the coated film is less than 50, preferably less than 35, preferably less than 20, preferably less than 10, and preferably less than 5 peaks per 5 cm² area.

The Surface Area Index is calculated from the "3-dimensional surface area" and the "lateral surface area" as follows. The "3-dimensional (3-D) surface area" of a sample area is the total exposed 3-D surface area including peaks and valleys. The "lateral surface area" is the surface area measured in the lateral direction. To calculate the 3-D surface area, four pixels with surface height are used to generate a pixel located in the centre with X, Y and Z dimensions. The four resultant triangular areas are then used to generate approximate cubic volume. This four-pixel window moves through the entire data-set. The lateral surface area is calculated by multiplying the number of pixels in the field of view by the XY size of each pixel. The surface area index is calculated by dividing the 3-D surface area by the lateral area, and is a measure of the relative flatness of a surface. An index which is very close to unity describes a very flat surface where the lateral (XY) area is very near the total 3-D area (XYZ).

A Peak-to-Valley value, referred to herein as "$PV_{95}$", may be obtained from the frequency distribution of positive and negative surface heights as a function of surface height referenced to the mean surface plane. The value $PV_{95}$ is the peak-to-valley height difference which envelops 95% of the peak-to-valley surface height data in the distribution curve by omitting the highest and lowest 2.5% of datapoints. The $PV_{95}$ parameter provides a statistically significant measure of the overall peak-to-valley spread of surface heights.

(ix) Specular Reflectance (Rs) of the OLED is measured using a Perkin Elmer Lambda 950 UV-visible-NIR spectrometer equipped with integrating sphere (10 cm diameter). The OLED lamp is mounted at the sample port of the sphere and the reflectance, relative to a Spectralon® standard, as expressed as an average across the wavelength range, 430 nm to 800 nm.

(x) Emission measurements at a viewing angle which is normal (perpendicular) to the surface of the OLED may be measured as luminance (according to the method of K. Saxena et al., Journal of Luminescence, 128, 525 (2008)) using a luminance meter (Konica Minolta model LS 110) equipped with a close up lens 110 which is specified to measure a minimum surface area p 0.4 mm. The measurements are performed in a dark environment to eliminate interference from stray background light and values of luminance (cd/m²) recorded after stable emission from the OLED source is established under a steady current of 50 mA. The emission signal from the OLED yields the maximum light output efficiency.

Measurements taken normal to the OLED surface do not give a complete characterization of out-coupling performance and a more complete characterization of the emission profile of an OLED requires measurement over a range of angles. Thus, emission measurements are also made by recording the angular dependence of emission using a Display Metrology System (DMS 803, Autronic Melchers GmbH; technical specification document BR001.4, April 2011). The same measurement conditions of dark environment and source stability as noted above are observed, and in this case emission was measured as spectral radiance over the wavelength range of 380 nm to 800 nm and at 5° intervals from normal to 70° from normal. The spectrally integrated emission signal from the OLED yields the total light output efficiency. Data collected using the DMS instrument allowed several further analyses to be performed.

Spectral radiance measured using the DMS may be processed using dedicated software to derive a colour point at each measurement based on the CIE (1976) u'v' colour space, as a function of angle to the normal to the plane of the OLED. These data may be used further to calculate $CD_{avg}$, the average colour difference or change in observed colour of the OLED lamp with angle of view (as taught in "Quantifying angular color stability of organic light-emitting diodes", A. Isphording, M. Pralle, Org. Elec., 11, 1916 (2010)).

The spectral radiance measurement may also be used to derive the External Quantum Efficiency (EQE; as taught in "Organic light emitting diodes (OLEDs) and OLED-based structurally integrated optical sensors", Y. Cai, PhD Thesis, Iowa State Univ., 2010), and the Power Conversion Efficiency (PCE) of the OLED. The latter is calculated by including values of operating current and voltage measured during current-voltage-light cycles, where a voltage is supplied to the device by a Keithley 2440 source meter which also measures the current running through the device. The light is detected using a photodiode connected to a Keithley 2400 multimeter and was calibrated with a luminance meter LS110 from Konica Minolta.

Lastly the solid angle of each OLED lamp may also be derived using the data collected during characterisation with the DMS.

The theory of the derivation is summarized in the following section and elsewhere in literature (see, for example, Japanese Journal of Applied Physics 2004 43 (11A) 7733-7736 by I. Tanaka et al.; Journal of Luminescence 2007 122-123 626-628 by H. Li et al.).

The raw optical data allows calculation of, inter alia:
Luminous flux (F) (or power): the total wavelength-weighted luminous power emitted in all directions of a light source, as detected by the human eye and based on the standard CIE 1931 photopic luminosity function (a standardised model of the sensitivity of the human eye to different wavelengths), in units of lumen, and calculated by the expression:

$$L_\lambda (cd/m^2) = Y_\lambda = 683(lm/W) \int_{400\,nm}^{800\,nm} S_y(\lambda) S(\lambda)_{measured} d\lambda$$

$$F = f\Omega L_\lambda$$

wherein, in this work, the measurement and integration is conducted across the wavelength range of 400 to 800 nm, and wherein:
F is the luminous flux (lumens),
$S(\lambda)_{measured}$ is the measured spectral power distribution of the emitted radiation (power per unit wavelength), in watts per metre per steradian (W/sr·nm·m²),
$S_y(\lambda)$ is the standard luminosity function (dimensionless),
λ is wavelength in metres, and
f is a factor that includes the measured angle independence (AI) of the OLED.

Luminous efficacy (η): is a measure of how efficiently the OLED light source produces visible light from electricity, and is the ratio of luminous flux (F) to the total electric power consumed by the source, in units of lumen/watt, and calculated according to the following equation (OLLA White Paper on the Necessity of Luminous Efficacy Measurement Standardisation of OLED Light Sources", IST-004607 Ed. OLLA WP5 members, (2007)):

$$\eta = \frac{F}{V_{applied} I_{applied}}$$

wherein:
η=luminous efficacy,
F=luminous flux, and
$V_{applied}$ and $I_{applied}$ are the voltage and current applied to the OLED Luminous intensity: referred to herein simply as "intensity"; the wavelength-weighted luminous flux (F) emitted from a surface per unit solid angle, i.e. luminous flux per steradian, in units of candela (lumen/sr).

Luminance: the wavelength-weighted luminous flux (F) emitted from a surface detected by the eye per unit solid angle per unit projected area perpendicular to the specified direction, in units of candela per square metre (cd/m²), and defined by the formula:

$$L_v = \frac{d^2\Phi_v}{dA d\Omega \cos\theta}$$

wherein
$L_v$ is the luminance (cd/m²) in the direction θ
$\Phi_v$ is the luminous power (lumen, lm),
θ is the angle between the surface normal and the specified direction,
A is the area of the surface (m²), and
Ω is the solid angle (sr) subtended by the measurement.

Radiance: the objective radiometric quantity analogous to luminance, i.e. the flux emitted from a surface per unit solid angle per unit projected area perpendicular to the specified direction, in units of watts per steradian per square meter (W/sr/m²), and defined by the formula:

$$L = \frac{d^2\Phi}{dAd\Omega\cos\theta} \approx \frac{\Phi}{\Omega A \cos\theta}$$

wherein:

L is the radiance (W/sr/m$^2$) in the direction $\theta$, $\Phi$ is the total radiant power (W) emitted, and otherwise as defined above.

The approximation is only appropriate for small A and $\Omega$ where $\cos\theta$ is approximately constant.

Angle dependence: Lambertian surfaces are unique in that they reflect incident light in a completely diffuse manner. It does not matter what the angle of incidence $\theta$ of an incoming ray is, the distribution of light leaving the surface remains unchanged. In other words, a Lambertian surface has a constant radiance or luminance that is independent of the viewing angle. When the Lambertian assumption holds, the total luminous flux (F) ($F_{tot}$ in the expression below) can be calculated from the peak luminous intensity ($I_{max}$), by integrating the cosine law:

$$F_{tot} = \int_0^{\pi/2}\int_0^{2\pi} \cos(\theta)I_{max}\sin(\theta)d\phi d\theta$$

$$= 2\pi \cdot I_{max} \int_0^{\pi/2} \cos(\theta)\sin(\theta)d\theta$$

$$= 2\pi \cdot I_{max} \int_0^{\pi/2} \frac{\sin(2\theta)}{2}d\theta$$

and so for a Lambertian surface:

$F_{tot} = \pi sr \cdot I_{max}$

When describing the angle-dependence of (non-Lambertian) OLEDs, the angle dependence of the emitted light is evaluated by first normalising all values over the angle range measured to the value measured normal to the OLED surface (i.e. $\theta=0$), and by this method the value of angle independence (AI) of the OLED can be calculated from normalized radiance. The normalised values are then compared to a Lambertian emitter (line (a) in FIG. 1). If the line (a) in FIG. 1 has a value of 1 (corresponding to a solid angle of $\pi sr$) then any value of less than 1 signifies an OLED with a non-Lambertian and angle-dependent emission profile. The non-Lambertian nature can also be expressed as a percentage of the ideal Lambertian profile. Ideally, the angle range measured is 0 to 90° from normal, but experimentally this is difficult, and so this work typically measured over an angle range of 0 to 70°, and optionally extrapolated to 90° by modelling the emission.

External Quantum Efficiency (EQE): a measure of the number of photons emitted into air from the device per injected electron, and calculated herein from the measured data as:

$$\eta_{EQE,measured}(\%) = f\Omega \frac{e}{I_{applied}} \int_{400\ nm}^{800\ nm} \frac{S(\lambda)_{measured}}{hc}d\lambda$$

wherein:

$\Omega$ is the solid angle, f is a factor that includes the measured angle independence (AI) of the OLED (the factor f corrects the solid angle from Lambertian ($\pi$) to the actual value of the solid angle. The normalization of the radiance (in 0-70° or preferably 0-90°) then yields a value around 1 where 1 means a $\pi$ solid angle. (Larger than 1 means super-Lambertian, smaller than 1 means sub-Lambertian characteristics)), $I_{applied}$ is the current applied to the OLED, $S(\lambda)_{measured}$ is the measured spectral power distribution of the emitted radiation (power per unit wavelength), in watts per metre, per steradian (W/sr·nm·m$^2$), where sr stands for steradian, and e is the unit charge, h is Planck's constant and c is the speed of light.

Colour and Angular Dependence of Emission Colour

Colour and the angular dependence of emission colour (also referred to as colour stability) are derived from measurements collected using the Display Metrology System (DMS 803, Autronic Melchers GmbH). Dedicated software is used to plot x, y chromaticity diagrams of the emission of OLEDs as a function of angle while colour difference and average colour difference ($CD_{avg}$) exhibited by the OLED are derived according to the calculations of Isphording (supra). $CD_{avg}$ is defined as the angular dependence of the chromaticity emitted from an OLED:

$$CD_{avg} = \sum_{1 \le i \le n}\sum_{i<j\le n} \frac{\Delta E_{ij}}{\frac{n(n+1)}{n} - n}.$$

and, $$\Delta E_{ij} = \sqrt{(\Delta u')^2 + (\Delta v')^2}$$
$$= \sqrt{(u'(\theta_i) - u'(\theta_j))^2 + (v'(\theta_i) - v'(\theta_j))^2}$$

where u' and v' define the colour point in CIE(1976) colour space while $\theta_i$, $\theta_j$ denote the angles under which the chromaticity is measured with i, j=1, 2, ... n and 0°≤$\theta$i≤90°.

(xi) A Veeco Daktak 6 stylus profiler with an accuracy of 5 nm is used to measure the thicknesses of the functional layers of the OLED device.

(xii) The refractive index of a layer is measured using a Prism Coupler Apparatus, manufactured by Metricon Corporation (Model 2010), and equipped with a laser source emitting at 633 nm. The principle of the measurement means that the refractive index value reported herein, and recorded at 633 nm, is the RI value at the surface of the layer, and RI is defined herein accordingly.

The invention is further illustrated by the following examples. The examples are not intended to limit the invention as described above. Modification of detail may be made without departing from the scope of the invention.

EXAMPLES

Example 1

Figure 2:
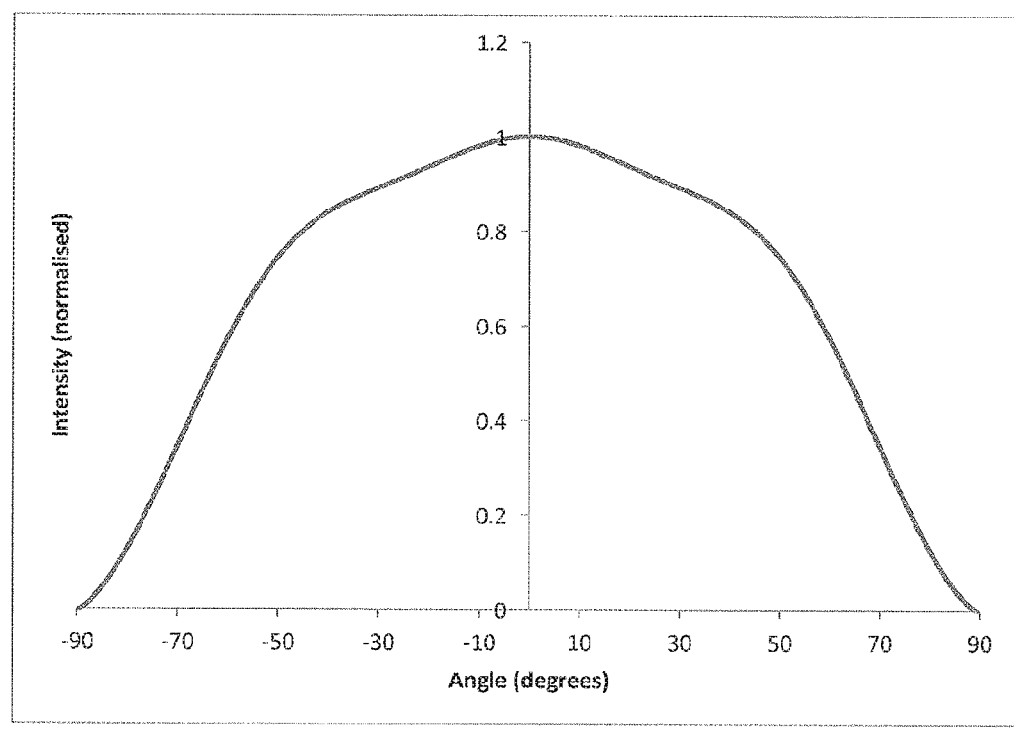
FIG. 2 shows the light profile emitted from a first series of bottom-emitting OLED light sources according to the invention.

The extraction efficiency of a first series of bottom-emitting OLED light sources was tested. Each OLED in the series used the same multi-layer light-emitting assembly, and the light profile emitted from that assembly is represented in FIG. 2.

The polyester film substrate in each OLED was a biaxially oriented PET film of thickness 100 μm comprising varying concentrations of $TiO_2$ light-scattering particles (P1). The $TiO_2$ particles had a particle size 200 nm and were in the rutile crystal form, and substantially spherical in shape. The $TiO_2$ is introduced into the polyester film substrate during extrusion in the form of a concentrated masterbatch of inorganic $TiO_2$ particles dispersed in polyester. The refractive index in the thickness direction of the filmed PET measured as described herein was approximately 1.5.

The organic planarising coating layer (OPC2) in each OLED was a cured cross-linked acrylate resin composition and had a dry thickness of 20 μm. The organic planarising coating layer (OPC2) comprised varying concentrations of $TiO_2$ light-scattering particles (P2) The light-scattering particles (P2) in layer OPC2 were the same as particles (P1) used for the polyester film substrate. Layer OPC2 further comprised non-light-scattering $TiO_2$ particles (P3) (particle size approximately 25 nm) at 80 wt % by total weight of the layer and sufficient to achieve a refractive index of the OPC2 layer of approximately 1.8.

For a given OLED in this first series of films, the concentration of light-scattering particles (P1) in the polyester film substrate is the same as the concentration of light-scattering particles (P2) in the organic planarising coating layer (OPC2). Thus, the x-axis in the graphs of FIGS. 3 and 4 below shows the particle concentration in each of the polyester film substrate and the organic planarising coating layer (OPC2), the concentration in the polyester film substrate being the same as the concentration in the organic planarising coating layer (OPC2) for a given OLED.

The OLED comprised barrier layers (B1) and (B2), each made from silicon nitride and 100 nm in thickness. The refractive index of each of the barrier layers was approximately 1.8.

In the construction of the OLED multilayer assembly, an organic planarising layer (OPC1) was disposed between the barrier layer (B1) and the internal surface of the polyester film substrate. The OPC1 layer was a UV-cured cross-linked acrylate resin composition and had a dry thickness 4 μm. The OPC1 layer contained no light-scattering particles, but did contain non-light-scattering $TiO_2$ particles (P4) (particle size approximately 25 nm) at concentration of 80 wt % and sufficient to achieve a refractive index of the OPC1 layer of approximately 1.8.

Figure 3:
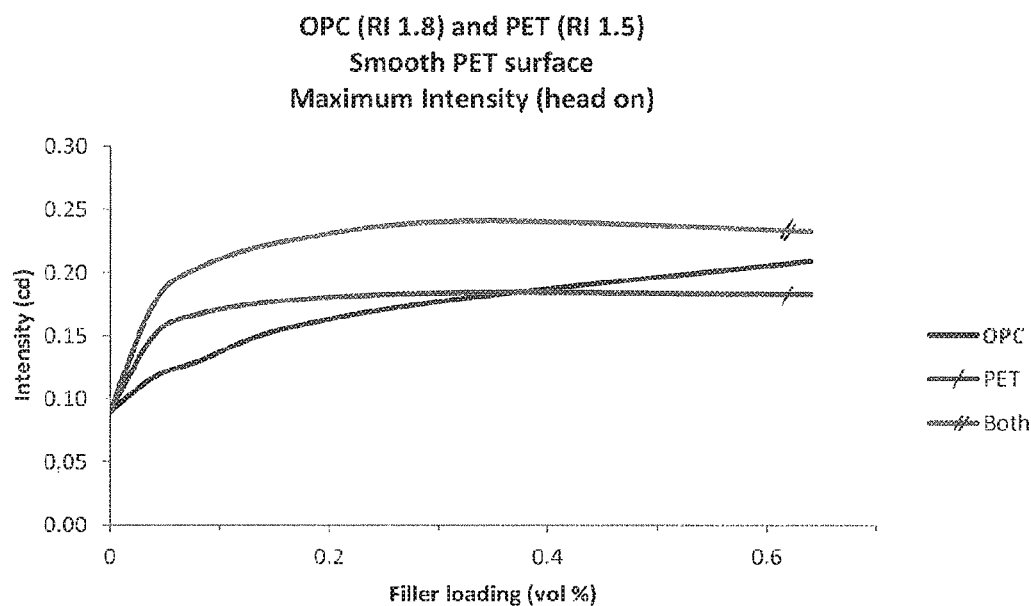
FIG. 3 shows the maximum light output efficiency (i.e. at a viewing angle perpendicular to the OLED surface) for the OLEDs used in FIG. 2.

The maximum light output efficiency (i.e. at a viewing angle perpendicular to the OLED surface) for each OLED is shown in FIG. 3. The total light output efficiency (i.e. summed across the hemisphere of all viewing angles from the OLED surface) is shown in FIG. 4

The data in FIG. 3 demonstrate that the combination of the internal and external extraction structures has the effect of increasing the maximum light output from the OLED, relative to the light output of an OLED with only one of either extraction structure.

Figure 4:
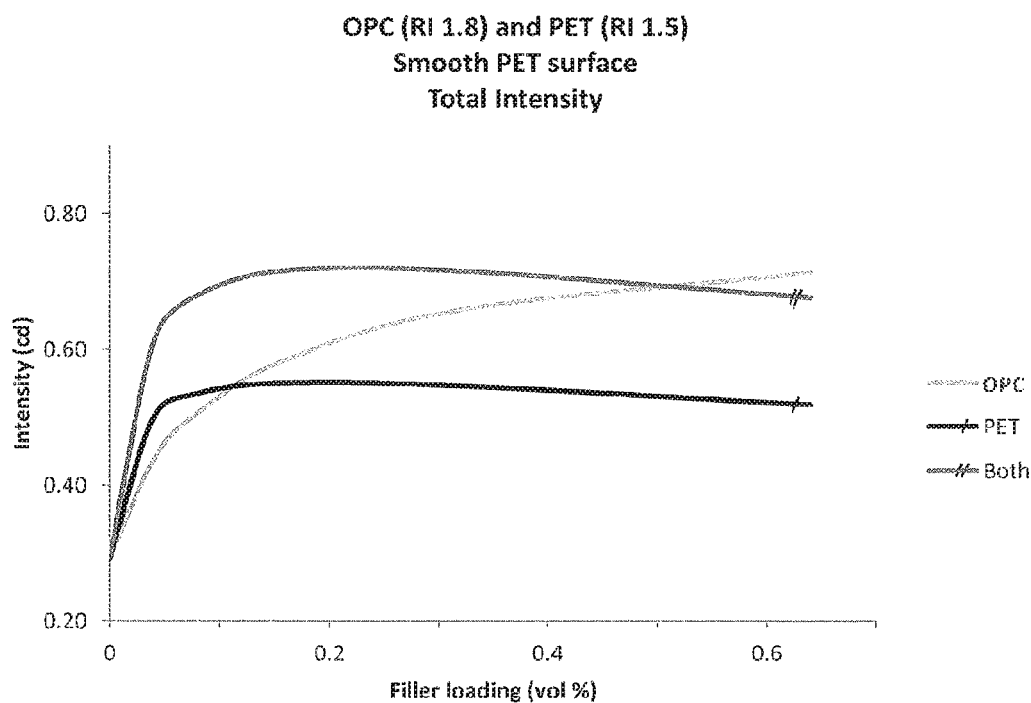
FIG. 4 shows the total light output efficiency (i.e., summed across the hemisphere of all viewing angles from the OLED surface) for the OLEDs used in FIG. 2.

The data in FIG. 4 demonstrate that the combination of the internal and external extraction structures also has the effect of increasing the total light output from the OLED at most concentrations although, advantageously, the maximum or asymptotic intensity level is reached at a much lower particle concentration in OLEDs according to the invention which utilise the dual-location approach, relative to OLEDs which only contain particles in the organic planarising layer (OPC2). Thus, OLEDs according to the invention can be made more efficiently and economically without detriment to the extraction efficiency.

Example 2

The extraction efficiency of a second series of bottom-emitting OLED light sources was tested. The OLEDs corresponded to those of Example 1, except that the internal surface of the polyester film substrate was roughened using the abrasive blasting technique described herein to produce a surface which exhibited roughness values Ra of 770 nm and Rq of 1140 nm and a haze of 90% (measured on the free-standing film in isolation and prior to application of the internal layers of the OLED described herein).

Figure 5:
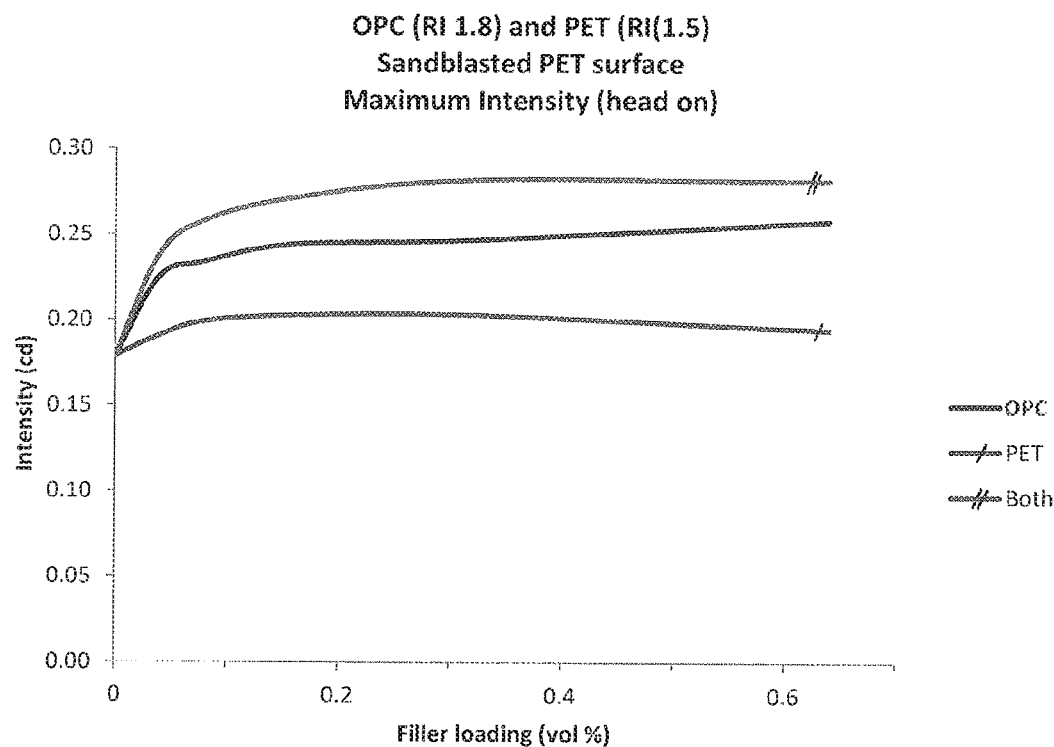
FIG. 5 shows the maximum light output efficiency for the OLEDs of a second OLED series according to the invention.
Figure 6:
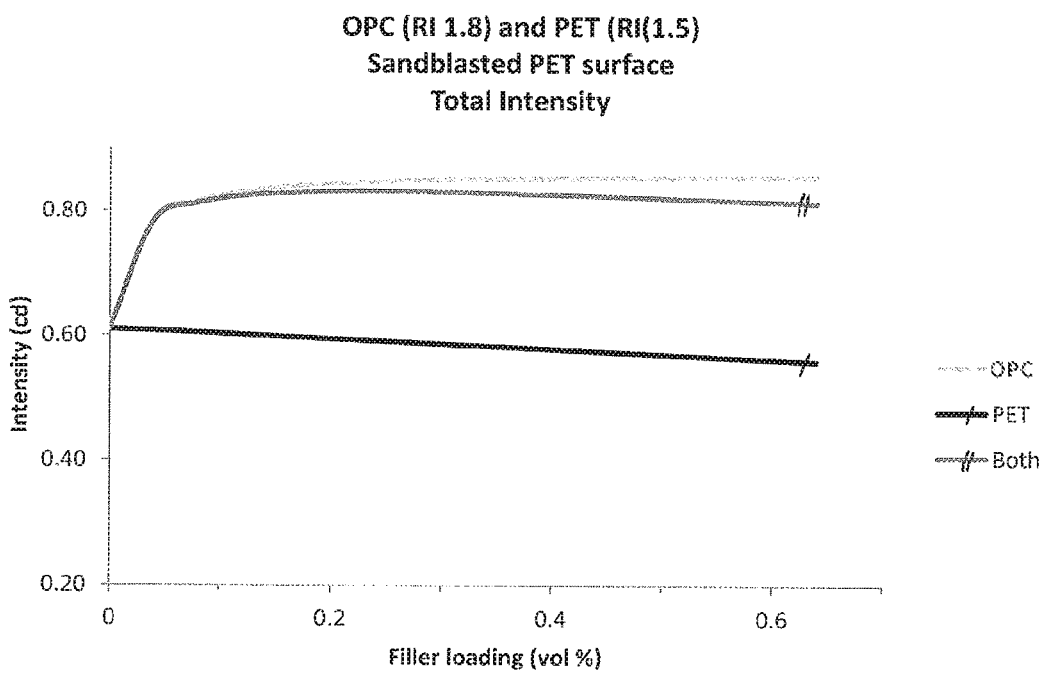
FIG. 6 shows the total light output efficiency for the OLEDs used in FIG. 5.
Figure 7:
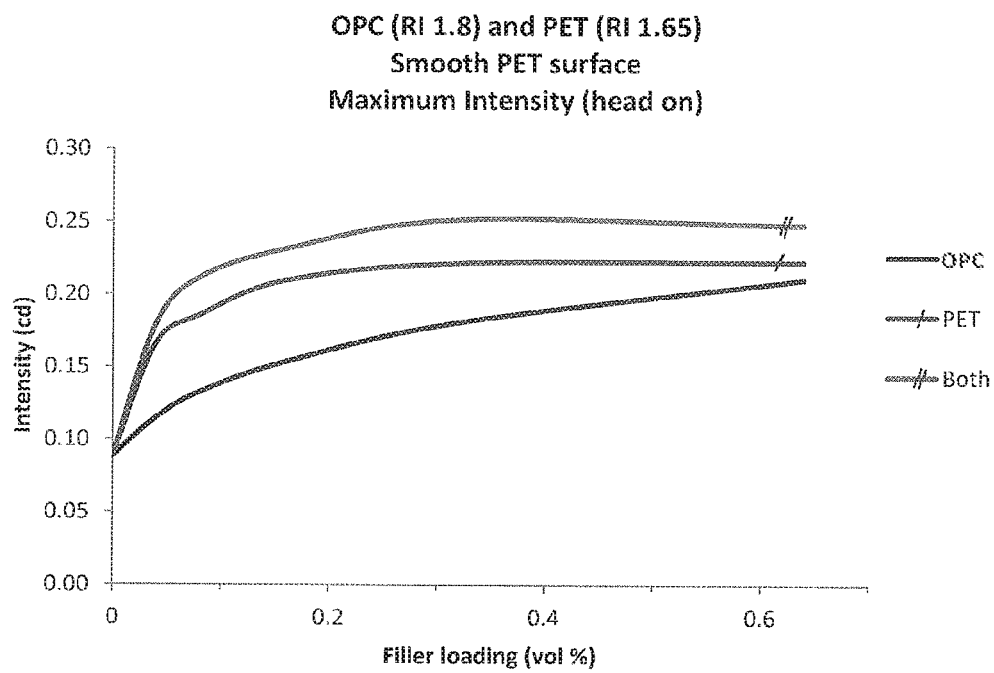
FIG. 7 shows the maximum light output efficiency for the OLEDs of a third OLED series according to the invention.
Figure 8:
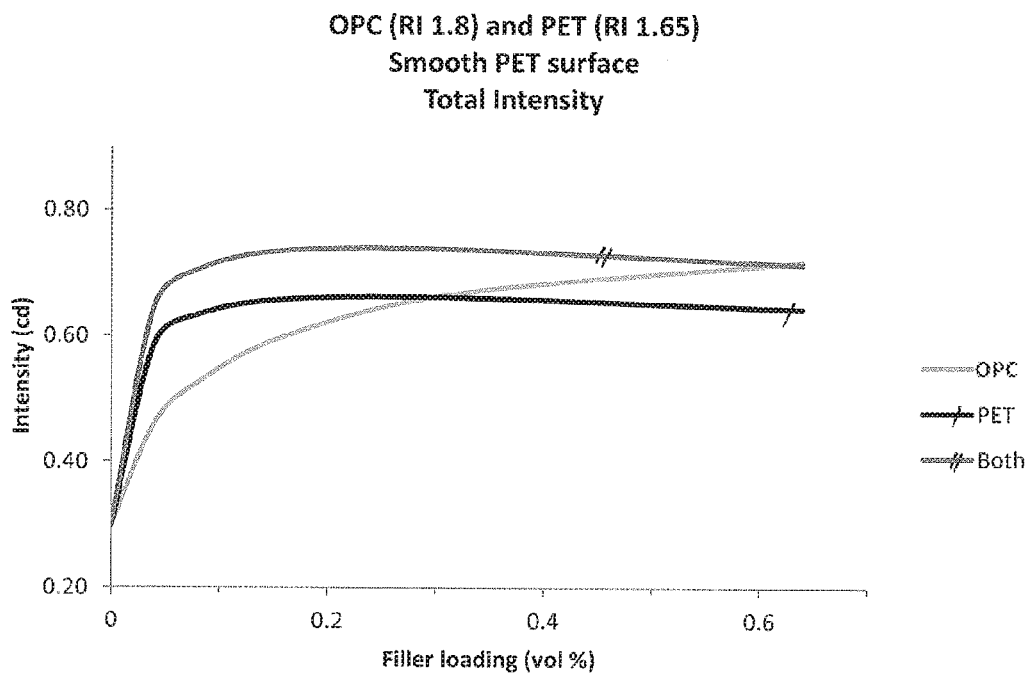
FIG. 8 shows the total light output efficiency for the OLEDs used in FIG. 7.
Figure 9:
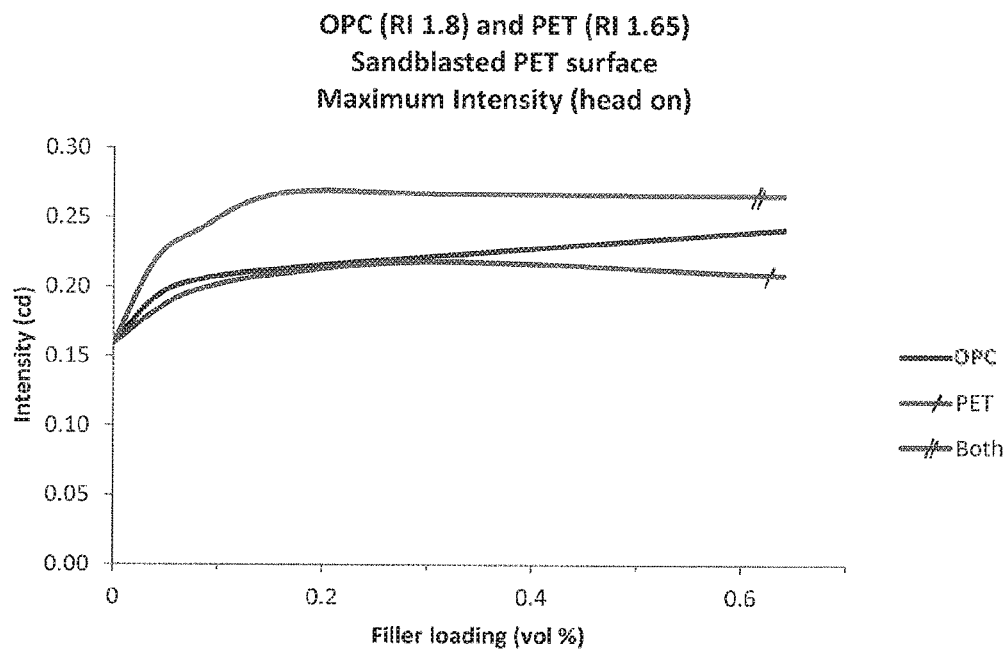
FIG. 9 shows the maximum light output efficiency for the OLEDs of a fourth OLED series according to the invention.
Figure 10:
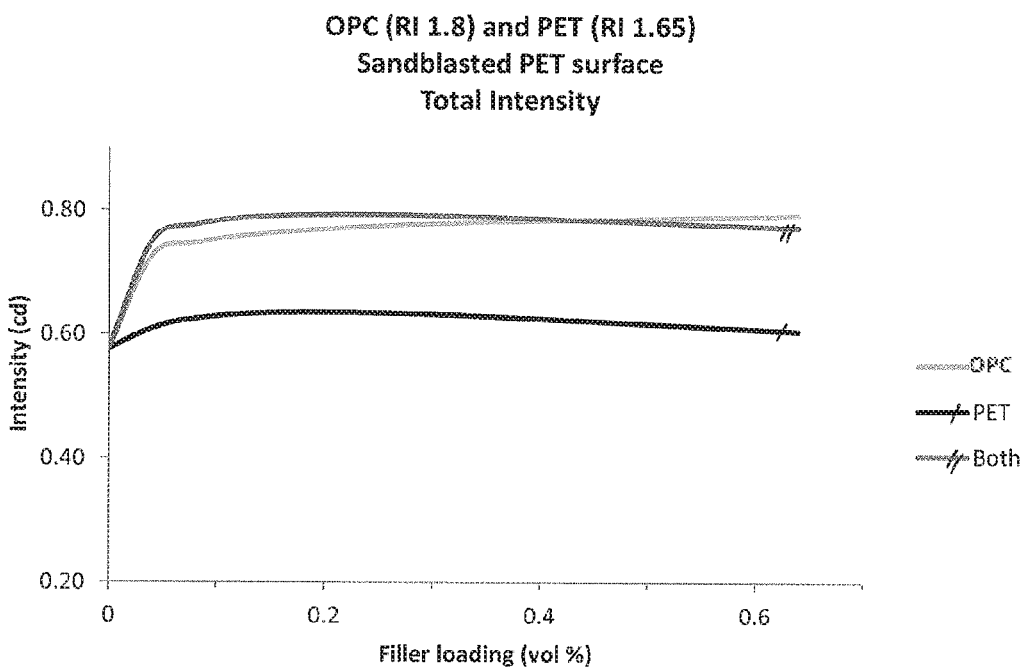
FIG. 10 shows the total light output efficiency for the OLEDs used in FIG. 9.

FIGS. 5 and 6 show the maximum and total light output efficiencies, respectively.

The data in FIG. 5 confirm the conclusion from FIG. 3, namely that the combination of the internal and external extraction structures has the effect of increasing the maximum light output from the OLED, relative to the light output of OLEDs with only one of either extraction structure.

A comparison of FIGS. 3 and 5 shows that the increased roughness of the internal surface of the polyester film substrate enhances the maximum light output from the OLED. It is unexpected that three extraction structures, two internal structures and one external structure, combine positively with each contributing to an incremental increase in extraction efficiency.

The data in FIG. 6 demonstrate the excellent total light output efficiency of OLEDs according to the present invention. Moreover, when the data in FIG. 6 are considered in tandem with the data in FIG. 5, it is apparent that the addition of particles in both the substrate and the organic planarising layer in tandem with a roughened internal surface of the substrate has the effect of increasing the normal intensity (i.e. increasing the directionality of the OLED light source) without any significant detriment to the total light output from the OLED device, and at the same particle concentration, thereby increasing the desirable light output characteristics of the OLED and improving the economy of OLED fabrication.

Example 3

This Example modifies Examples 1 and 2 by changing the refractive index of the polyester film substrate to 1.65. Increasing the RI of PET from 1.5 to 1.65 requires 10 wt % of non-light-scattering $TiO_2$ particles (RI 2.874; size less than 60 nm). In this way, a third and fourth series of OLED light sources are generated, one with a smooth internal surface of the polyester film substrate and one with an abrasion-blasted internal surface. The maximum and total light output efficiencies for each series are shown in FIGS. 7 to 10. The results are consistent with the conclusions from the first and second series.

Figure 11:
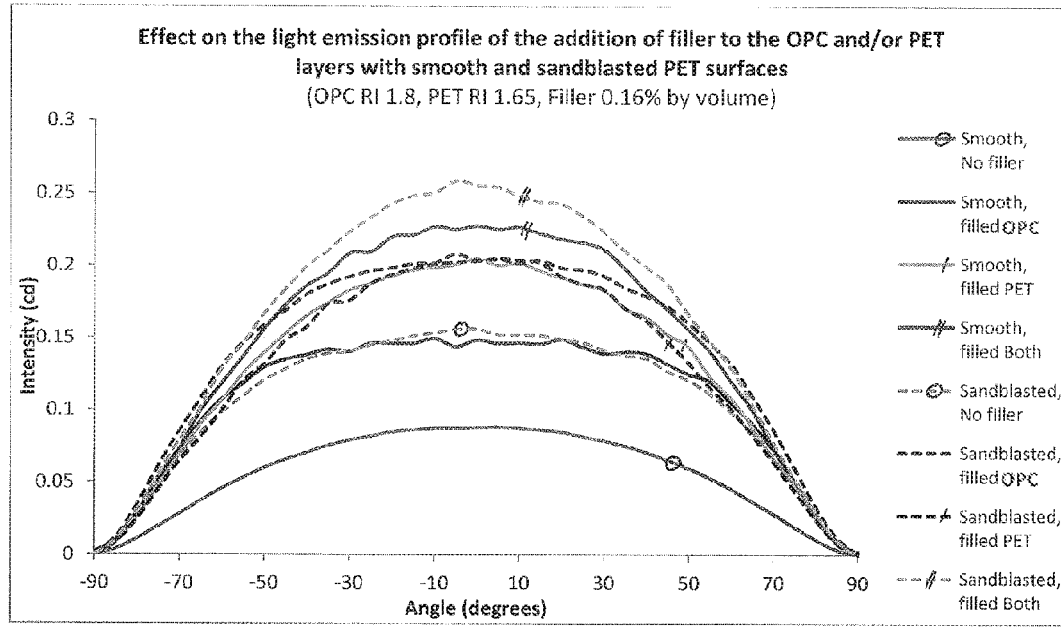
FIG. 11 shows the light emission profile of OLED light sources according to the invention, comprising light-scattering particles in an amount of 0.16 vol % in each of the polyester film substrate and/or the organic planarising layer (OPC2), compared against control OLEDs comprising no light-scattering particles in these layers.
Figure 12:
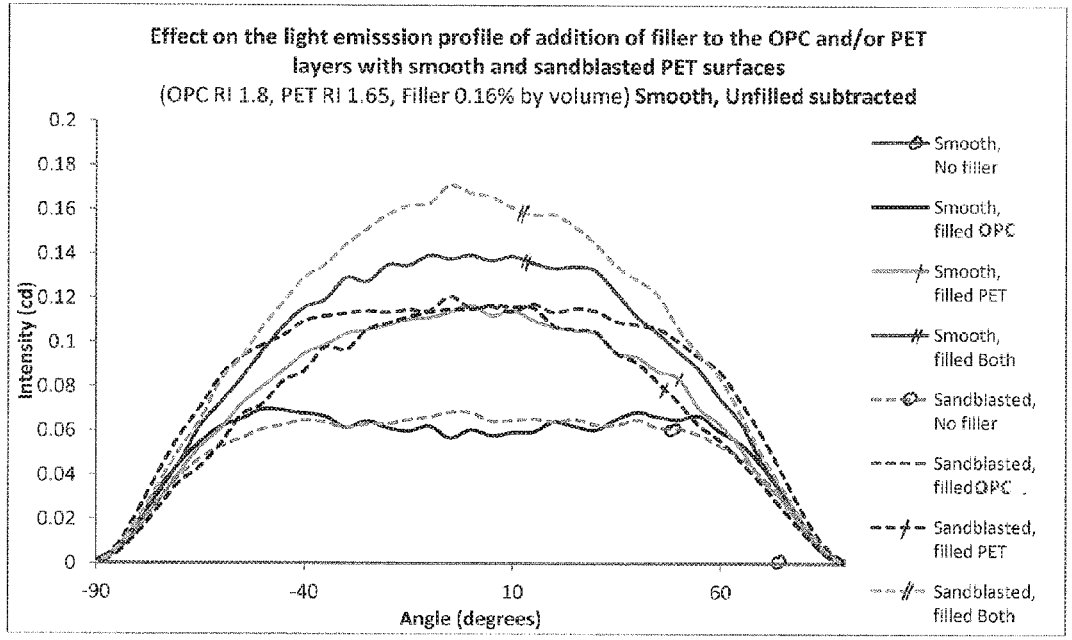
FIG. 12 presents the same data shown in FIG. 11, except that the emission profile of the smooth unfilled control OLED has been subtracted from that of the OLEDs comprising filled layers and/or a roughened substrate.

The light emission profile (i.e. the angular dependence) of OLED light sources comprising light-scattering particles in an amount of 0.16 vol % in each of the polyester film substrate and/or the organic planarising layer (OPC2) was compared against control OLEDs comprising no light-scattering particles in these layers. The results are shown in FIG. 11. FIG. 12 presents the same data except that the emission profile of the smooth unfilled control OLED has been subtracted from that of the OLEDs comprising filled layers and/or a roughened substrate. The data show that, surprisingly, the greatest value of the maximum intensity (HOB) is achieved when both the polyester film substrate and organic planarising layer (OPC2) contain light-scattering particles, with the greatest enhancement of the maximum intensity being achieved with the roughened internal surface of the polyester film substrate.

Example 4

This Example corresponds to Example 3 except that the concentration of $TiO_2$ light-scattering particles (P2) in the organic planarising coating layer (OPC2) is varied independently of the concentration of $TiO_2$ light-scattering particles (P1) in the polyester film substrate. In this way, a fifth and sixth series of OLEDs are generated, one with a smooth internal surface of the polyester film substrate and one with an abrasion-blasted internal surface.

Figure 13A:
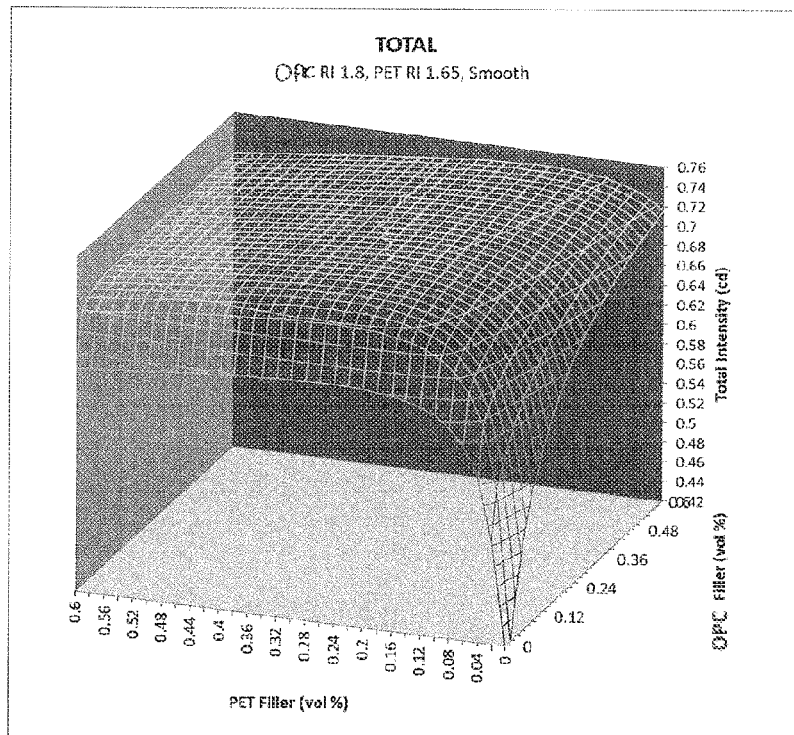
FIG. 13a shows the total light output efficiency of a fifth series of OLEDs according to the invention, employing a smooth polyester film substrate and independent variation of light-scattering particles in the organic planarising coating layer and the polyester film substrate.
Figure 13B:
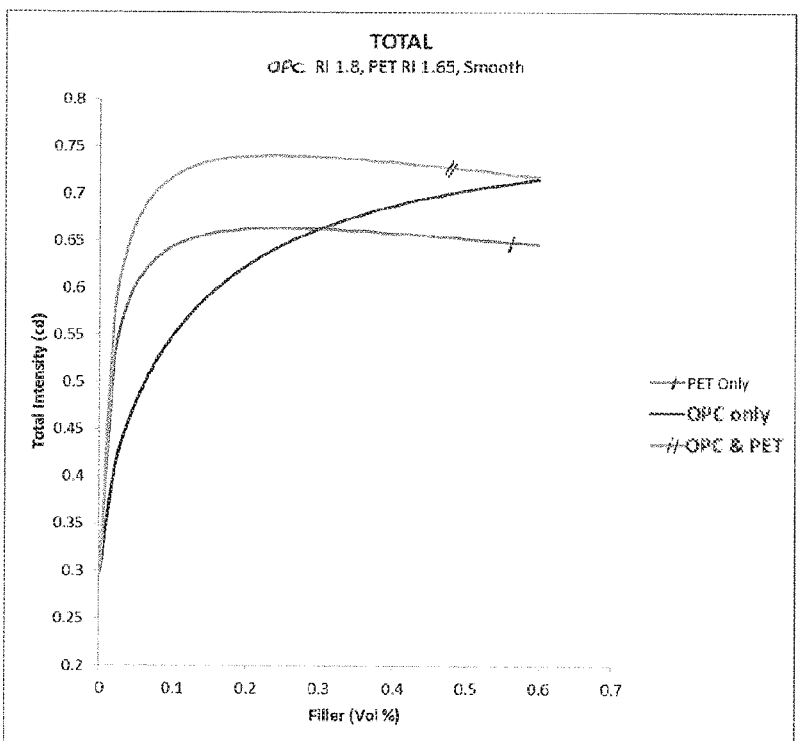

FIGS. 13a and 13b show the total light output efficiency for the smooth polyester film substrate. FIG. 13b presents the variation in total intensity for the three specific assemblies of Example 4 (i.e. only the PET substrate layer filled, only the OPC2 layer filler, and both the PET substrate and OPC2 layer filled), in a format similar to FIGS. 4, 6, 8 and 10, and is derived from the data shown in the contour plot of FIG. 13a. The dependence of total emitted intensity on the vol % of scatter particles in the OPC2 layer only is derived from the surface of the contour plot for all values of OPC2 filler where PET vol %=0. Similarly, the dependence of total emitted intensity on the vol % of scatter particles in the PET layer only is derived from the surface of the contour plot for all values of PET filler where OPC2 vol %=0. The curve in FIG. 13b marked as OPC and PET represents all points on the surface of the contour plot of FIG. 13a for which the particle content (vol %) in the PET substrate equals the particle content (vol %) in the OPC2 layer.

Figure 14A:
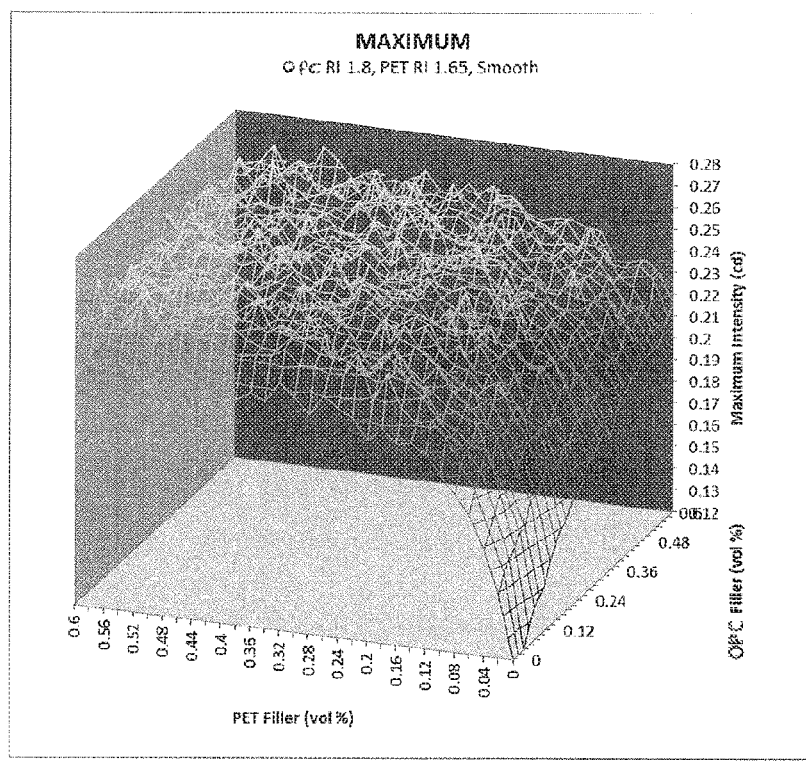
Figure 14B:
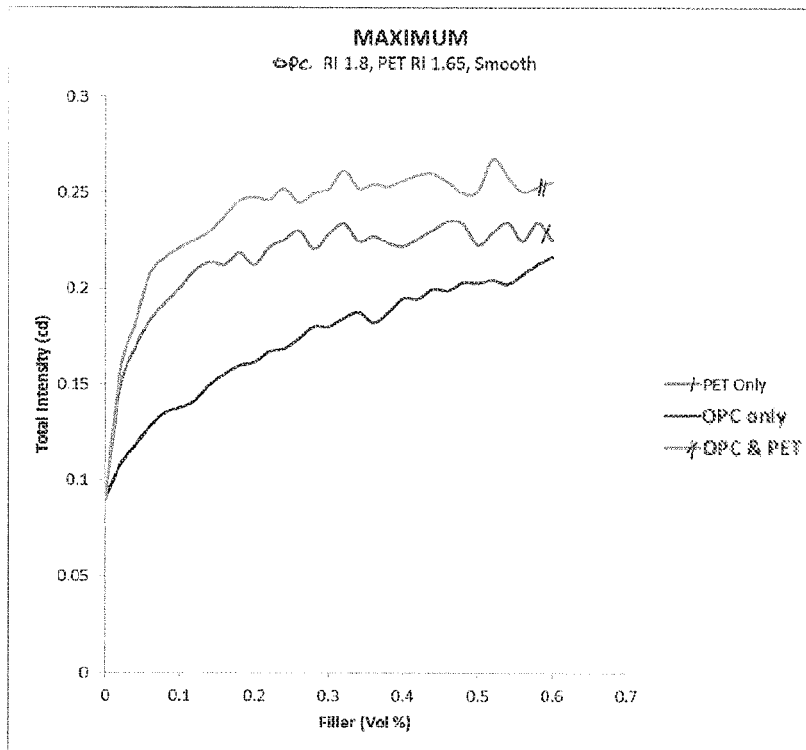
Figure 15A:
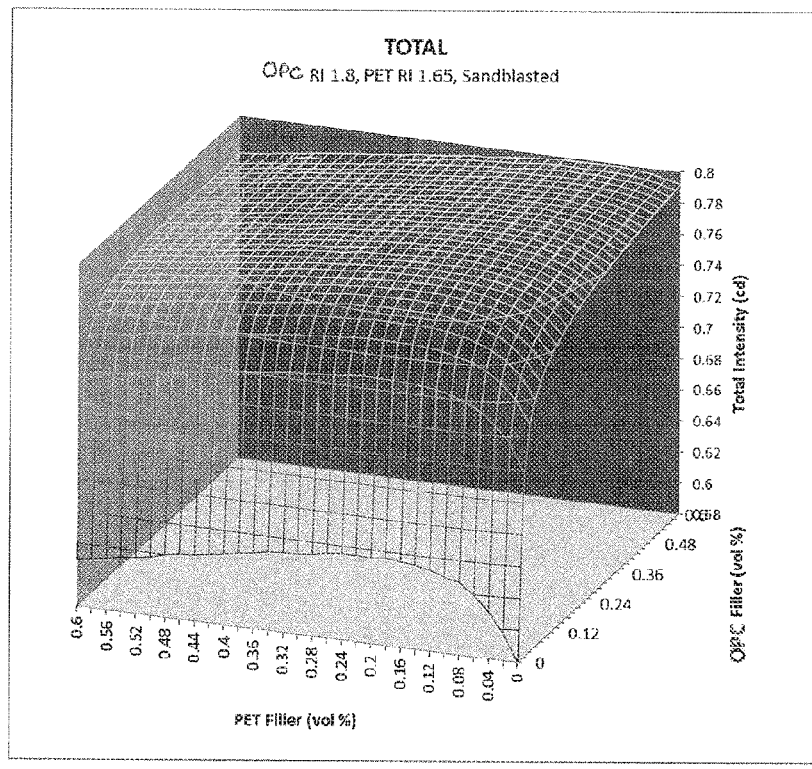
FIG. 15a shows the total light output efficiency of a sixth series of OLEDs according to the invention, employing an abrasion-blasted polyester film substrate and independent variation of light-scattering particles in the organic planarising coating layer and the polyester film substrate.
Figure 15B:
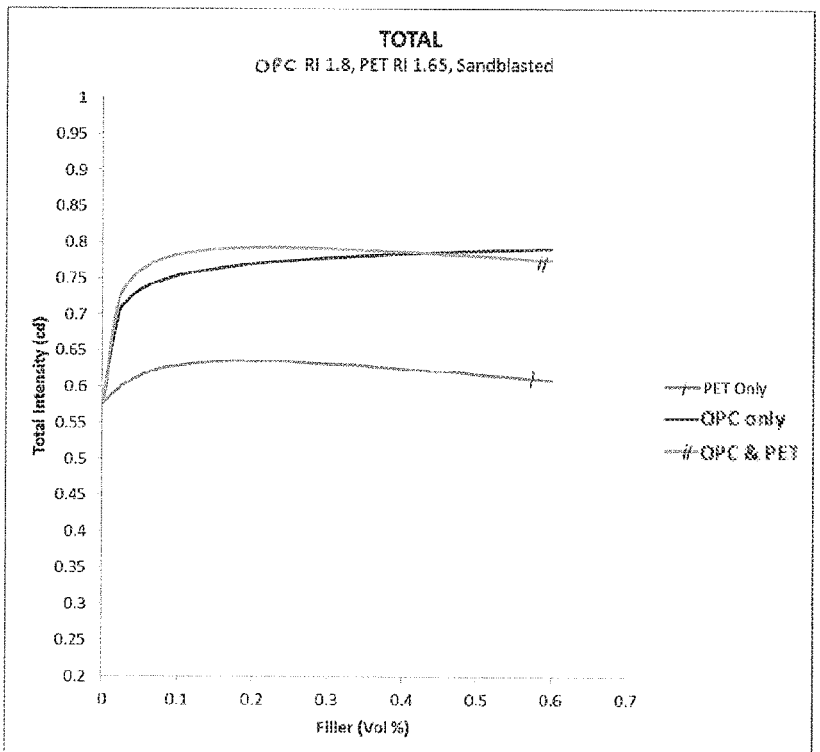
Figure 16A:
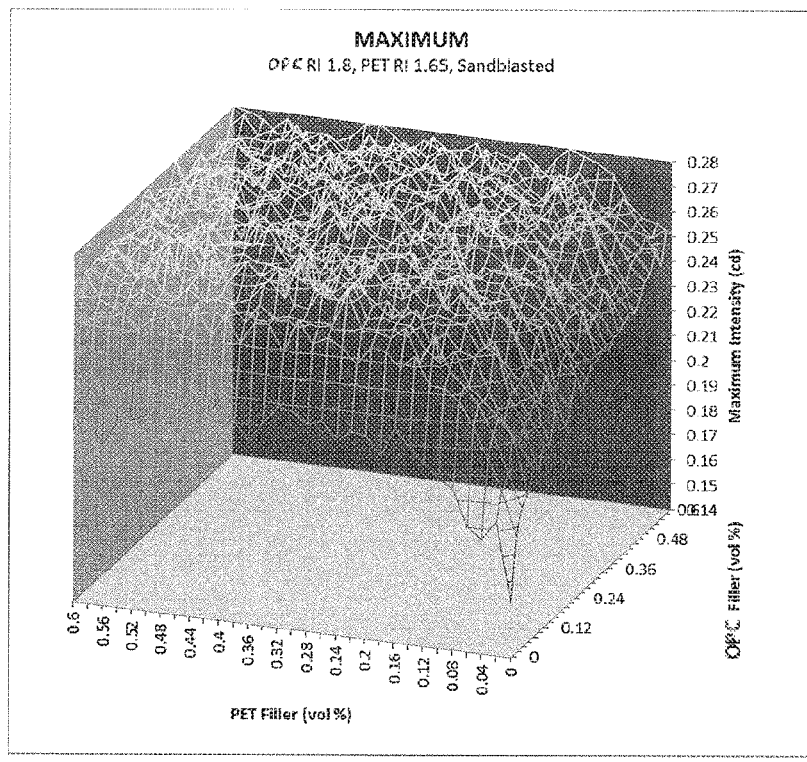
Figure 16B:
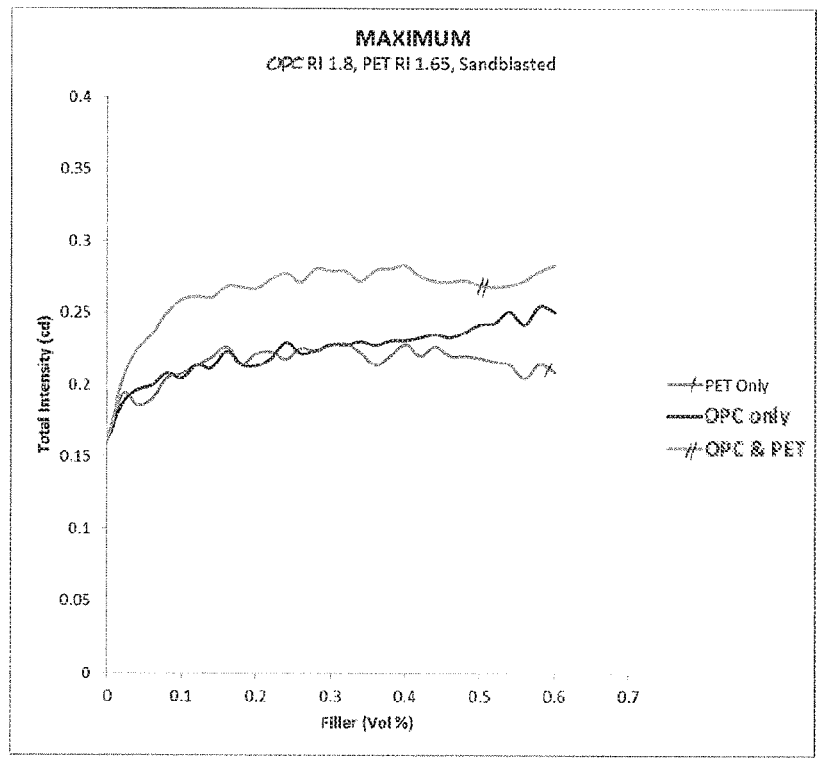

Similarly, the maximum light output efficiency for the smooth polyester film substrate is shown in FIGS. 14a and 14b.

The corresponding data for the assemblies comprising an abrasion-blasted polyester film substrate are shown in FIGS. 15a, 15b, 16a and 16b.

The results confirm the conclusions noted above.

For the avoidance of doubt, the reference to "OPC" in the figures herein is a reference to the organic planarising coating layer (OPC2).

The invention claimed is:

1. An organic light-emitting diode (OLED) light source comprising the following layers, in order:
   (i) a biaxially oriented polyester film substrate comprising light-scattering particles (P1);
   (ii) optionally an organic planarising coating layer (OPC1);
   (iii) optionally a barrier layer (B1);
   (iv) an organic planarising coating layer (OPC2) comprising light-scattering particles (P2);
   (v) optionally a barrier layer (B2); and
   (vi) a multi-layer light-emitting assembly comprising a first electrode, a light-emitting organic layer and a second electrode;
   wherein said OLED light source comprises at least one of barrier layers (B1) and (B2).

2. The OLED light source according to claim 1 which is a bottom-emitting OLED.

3. The OLED light source according to claim 1 which is flexible.

4. The OLED light source according to claim 1 wherein the thickness of the polyester film substrate is in the range of from about 25 to about 250 μm.

5. The OLED light source according to claim 1 wherein said polyester film substrate is selected from a poly(ethylene terephthalate) film and a poly(ethylene naphthalate) film.

6. The OLED light source according to claim 1 wherein said light-scattering particles (P1) are selected from non-voiding inorganic particles, voiding inorganic particles and incompatible resin filler particles, and mixtures thereof.

7. The OLED light source according to claim 1 wherein said light-scattering particles (P1) are selected from non-voiding inorganic particles.

8. The OLED light source according to claim 1 wherein said polyester film substrate comprises light-scattering particles (P1) in an amount of from about 0.01 to about 1.0 vol %, based on the total volume of a polyester film substrate of thickness of 100 μm, wherein concentration ranges at other film thicknesses are calculated according to the formula:

$$V_T = V_{100}(100/T)$$

wherein:
$V_T$ is the particle concentration at a thickness T
$V_{100}$ is said particle concentration in said substrate having a thickness of 100 μm.

9. The OLED light source according to claim 1 wherein said polyester film substrate exhibits a haze of at least about 30% and/or a total light transmittance (TLT) of at least about 60%.

10. The OLED light source according to claim 1 wherein said polyester film substrate exhibits a shrinkage of less than 1% at 150° C. over 30 minutes in both the longitudinal and transverse dimensions.

11. The OLED light source according to claim 1 wherein the internal surface of the polyester film substrate exhibits a surface roughness such that the Roughness Average (Ra) value is at least about 50 nm, and/or such that the Root Mean Square Roughness (Rq) value is at least about 50 nm.

12. The OLED light source according to claim 11 wherein said OLED comprises an organic planarising coating layer (OPC1) on a surface of said polyester film substrate and barrier layer (B1) on the surface of said planarising coating layer (OPC1).

13. The OLED light source according to claim 1 wherein the first barrier layer (B1) and the second barrier layer (B2) are independently selected from inorganic barrier layers selected from the group consisting of metals and the oxides, nitrides and sulphides of Groups IVB, VB, VIB, IIIA, IIB, IVA, VA and VIA of the Periodic Table, and combinations thereof; and preferably from $SiO_2$, SiO, GeO, $Al_2O_3$, ZnO, $ZrO_2$, $HfO_2$, AlN, TiN, $Si_3N_4$, Al, Ag, Au, Pt and Ni.

14. The OLED light source according to claim 1 wherein the first barrier layer (B1) and the second barrier layer (B2) are independently selected to exhibit a thickness in the range of from about 2 nm to about 200 nm.

15. The OLED light source according to claim 1 wherein the assembly comprising (i) the polyester film substrate comprising light-scattering particles (P1); (ii) planarising coating layer (OPC1); (iii) optional barrier layer (B1); (iv) organic planarising coating layer (OPC2) comprising light-scattering particles (P2); and (v) optional barrier layer (B2), wherein at least one of said barrier layers is present, exhibits a water vapour transmission rate of less than $10^{-3}$ g/m²/day and/or an oxygen transmission rate of less than $10^{-3}$ /mL/m²/day.

16. The OLED light source according to claim 1 wherein said organic planarising coating layer(s) is/are independently derived from compositions comprising polymerisable and cross-linkable monomeric compounds and/or polymerisable and cross-linkable oligomeric compounds.

17. The OLED light source according to claim 1 wherein the light-scattering particles (P2) in the organic planarising coating layer (OPC2) are selected from non-voiding inorganic particles, voiding inorganic particles and incompatible resin filler particles, and mixtures thereof.

18. The OLED light source according to claim 1 wherein said organic planarising layer (OPC2) comprises light-scattering particles (P2) in an amount of from about 0.01 to about 1.0 vol %, based on the total volume of an organic planarising layer (OPC2) of thickness of 20 µm, wherein concentration ranges at other layer thicknesses are calculated according to the formula:

$$V_T = V_{20}(20/T)$$

wherein:
$V_T$ is the particle concentration at a thickness T
$V_{20}$ is said particle concentration in said organic planarising layer (OPC2) having a thickness of 20 µm.

19. The OLED light source according to claim 1 wherein the thickness of the organic planarising coating layer (OPC2) is from about 5 to about 50 µm.

20. The OLED light source according to claim 1 wherein said light-scattering particles (P1) and (P2) are independently selected to have a volume distributed median particles diameter in the range of from about 150 nm to 500 nm.

21. The OLED light source according to claim 1 wherein the organic planarising layer (OPC2) and/or where present the organic planarising layer (OPC1) further comprise non-light-scattering particles in amounts of up to about 80 wt %, based on the total weight of the layer.

22. The OLED light source according to claim 1 wherein the refractive indices of the barrier layer(s) and the organic planarising coating layer(s) are independently selected to exhibit an RI of from about 1.75 to about 1.85, and the RI of the polyester film substrate is in the range of from about 1.45 to about 1.55.

23. A method for fabricating an OLED light-source as defined in claim 1 comprising the steps of:
  (i) providing a polyester film substrate comprising light-scattering particles (P1);
  (ii) optionally disposing an organic planarising coating layer (OPC1) on a surface of said polyester film substrate;
  (iii) optionally disposing a barrier layer (OPC2) on a surface of said polyester film substrate or, where present, on the surface of the organic planarising coating layer (OPC1);
  (iv) disposing an organic planarising coating layer (OPC2) comprising light-scattering particles (P2) on a surface of the polyester film substrate or on the surface of the barrier layer (B1) where the barrier layer (B1) is present;
  (v) optionally disposing a barrier layer (B2) on the surface of the organic planarising coating layer (OPC2); and
  (vi) disposing a multi-layer light-emitting assembly comprising a first electrode, a light-emitting organic layer and a second electrode on a surface of the organic planarising coating layer (OPC2) or on the surface of the barrier layer (B2) where the barrier layer (B2) is present, wherein step (vi) may be a multi-step process;
  and wherein said process comprises at least one of steps (iii) and (v).

24. The method according to claim 23 further comprising the steps of providing a first electrode, a light-emitting organic layer, a second electrode, and an encapsulating layer over the second electrode.

25. The method according to claim 23 further comprising the step of imparting surface roughness to the internal surface of the polyester film substrate by sandblasting the surface of the polyester film substrate.

26. The method according to claim 25 wherein the method comprises the step of disposing an organic planarising coating layer (OPC1) on a surface of said polyester film substrate and disposing a barrier layer (B1) on the surface of the organic planarising coating layer (OPC1).

27. An OLED light source fabricated according to the method of claim 23.

28. A method of modulating the directionality of emitted light from an OLED light source comprising a substrate and a multi-layer light-emitting assembly comprising a first electrode, a light-emitting organic layer and a second electrode, said method comprising
  (i) providing a biaxially oriented polyester film comprising light-scattering particles (P1) as said substrate of said OLED;
  (ii) optionally disposing an organic planarising coating layer (OPC1) on a surface of said polyester film substrate;
  (iii) optionally disposing a barrier layer (B1) on a surface of said polyester film substrate or, where present, on the surface of the organic planarising coating layer (OPC1);
  (iv) disposing an organic planarising coating layer (OPC2) comprising light-scattering particles (P2) on a surface of the polyester film substrate or on the surface of the barrier layer (B1) where the barrier layer (B1) is present;
  (v) optionally disposing a barrier layer (B2) on the surface of the organic planarising coating layer (OPC2); and
  (vi) disposing a multi-layer light-emitting assembly comprising a first electrode, a light-emitting organic layer and a second electrode on a surface of the organic planarising coating layer (OPC2) or on the surface of the barrier layer (B2) where the barrier layer (B2) is present, wherein step (vi) may be a multi-step process;
  and wherein said process comprises at least one of steps (iii) and (v).

29. Use of a biaxially oriented polyester film comprising light-scattering particles (P1) to modulate the directionality of emitted light from an OLED light source, wherein said OLED light source comprises the following layers, in order:
  (i) a biaxially oriented polyester film substrate comprising light-scattering particles (P1);
  (ii) optionally an organic planarising coating (OPC1) layer;
  (iii) optionally a barrier layer (B1);
  (iv) an organic planarising coating layer (OPC2) comprising light-scattering particles (P2);
  (v) optionally a barrier layer (B2); and
  (vi) a multi-layer light-emitting assembly comprising a first electrode, a light-emitting organic layer and a second electrode;
  wherein said OLED light source comprises at least one of barrier layers (B1) and (B2).

30. Use of light-scattering particles to modulate the directionality of emitted light from an OLED light source, wherein said light-scattering particles are disposed in an OLED light source comprising the following layers in order:
  (i) a biaxially oriented polyester film substrate comprising light-scattering particles (P1);
  (ii) optionally an organic planarising coating (OPC1) layer;
  (iii) optionally a barrier layer (B1);

(iv) an organic planarising coating layer (OPC2) comprising light-scattering particles (P2);
(v) optionally a barrier layer (B2); and
(vi) a multi-layer light-emitting assembly comprising a first electrode, a light-emitting organic layer and a second electrode;
wherein said OLED light source comprises at least one of barrier layers (B1) and (B2).

31. The OLED light source according to claim 4 wherein the thickness of the polyester film substrate is in the range of from about 50 to about 150 μm.

32. The OLED light source according to claim 5 wherein said polyester film substrate is a poly(ethylene naphthalate) film.

33. The OLED light source according to claim 7 wherein said light-scattering particles (P1) are titanium dioxide particles.

34. The OLED light source according to claim 8 wherein said amount of light-scattering particles (P1) is from about 0.05 to about 0.5 vol %.

35. The OLED light source according to claim 13 wherein the first barrier layer (B1) and the second barrier layer (B2) are independently selected from inorganic barrier layers selected from the group consisting of $SiO_2$, SiO, GeO, $Al_2O_3$, ZnO, $ZrO_2$, $HfO_2$, AlN, TiN, $Si_3N_4$, Al, Ag, Au, Pt and Ni.

36. The OLED light source according to claim 13 wherein the first barrier layer (B1) and the second barrier layer (B2) are silicon nitride layers.

37. The OLED light source according to claim 14 wherein the first barrier layer (B1) and the second barrier layer (B2) are independently selected to exhibit a thickness in the range of from about 10 to about 150 nm.

38. The OLED light source according to claim 14 wherein the first barrier layer (B1) and the second barrier layer (B2) are independently selected to exhibit a thickness in the range of from about 50 to about 120 nm.

39. The OLED light source according to claim 16 wherein said monomeric compounds are monomeric acrylates and said oligomeric compounds are oligomeric acrylates.

40. The OLED light source according to claim 16 wherein said compositions comprise (i) a polymerisable monomeric reactive diluent selected from a monomeric acrylate; and/or (ii) an unsaturated oligomer selected from acrylates, urethane acrylates, polyether acrylates, epoxy acrylates, melamine acrylates and polyester acrylates); (iii) optionally a photoinitiator; and (iv) optionally a solvent.

41. The OLED light source according to claim 17 wherein the light-scattering particles (P2) in the organic planarising coating layer (OPC2) are titanium dioxide particles.

42. The OLED light source according to claim 18 wherein said amount of light-scattering particles (P1) is from about 0.05 to about 0.5 vol %.

43. The OLED light source according to claim 21 wherein the non-light-scattering particles are selected from $TiO_2$ and $ZrO_2$.

* * * * *

UNITED STATES PATENT AND TRADEMARK OFFICE
CERTIFICATE OF CORRECTION

Page 1 of 1

PATENT NO. : 9,711,758 B2
APPLICATION NO. : 14/907717
DATED : July 18, 2017
INVENTOR(S) : Duncan Henry Mackerron et al.

It is certified that error appears in the above-identified patent and that said Letters Patent is hereby corrected as shown below:

At Column 33, Line 45, in Claim 23, "a barrier layer (OPC2)" should read --a barrier layer (B1)--.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*